United States Patent
Yamamoto et al.

(10) Patent No.: US 8,461,929 B2
(45) Date of Patent: Jun. 11, 2013

(54) POWER AMPLIFIER

(75) Inventors: Kazuya Yamamoto, Tokyo (JP); Miyo Miyashita, Tokyo (JP); Takayuki Matsuzuka, Tokyo (JP); Kenji Mukai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/195,066

(22) Filed: Aug. 1, 2011

(65) Prior Publication Data

US 2012/0154055 A1 Jun. 21, 2012

(30) Foreign Application Priority Data

Dec. 20, 2010 (JP) ................................ 2010-283156

(51) Int. Cl.
  *H03G 3/30* (2006.01)
(52) U.S. Cl.
  USPC .......................................... 330/284; 330/310
(58) Field of Classification Search
  USPC ................... 330/310, 302, 284, 98, 133–134, 330/150, 299
  See application file for complete search history.

(56) References Cited

U.S. PATENT DOCUMENTS

| | | | |
|---|---|---|---|
| 5,742,206 A * | 4/1998 | Ishida | 330/284 |
| 6,064,265 A * | 5/2000 | Yun et al. | 330/279 |
| 6,075,414 A | 6/2000 | Nagaoka et al. | |
| 7,508,267 B1 * | 3/2009 | Yu et al. | 330/286 |
| 7,609,126 B2 | 10/2009 | Yamamoto et al. | |
| 2003/0218500 A1 | 11/2003 | Yamamoto et al. | |
| 2007/0285174 A1 | 12/2007 | Yamamoto | |
| 2010/0301944 A1 | 12/2010 | Yamamoto et al. | |

FOREIGN PATENT DOCUMENTS

| | | |
|---|---|---|
| JP | 61-210716 A | 9/1986 |
| JP | 62-143507 A | 6/1987 |
| JP | 1-255469 A | 10/1989 |
| JP | 10-261925 A | 9/1998 |
| JP | 2000-188524 A | 7/2000 |
| JP | 2001-111368 A | 4/2001 |
| JP | 2002-171101 A | 6/2002 |
| JP | 2003-347870 A | 12/2003 |
| JP | 2006-166153 A | 6/2006 |
| JP | 2007-74028 A | 3/2007 |
| JP | 2008-11482 A | 1/2008 |
| JP | 2010-278521 A | 12/2010 |

* cited by examiner

*Primary Examiner* — Hieu Nguyen
(74) *Attorney, Agent, or Firm* — Leydig, Voit & Mayer, Ltd.

(57) ABSTRACT

A power amplifier includes a first amplifier unit, a second amplifier unit, and an attenuator. The second amplifier receives a signal from the first amplifier unit and amplifies the signal. The attenuator is provided between the first and second amplifier units. The attenuator has arms, including at least one parallel arm and at least one series arm, and has switches connected to the arms to switch the electrical connection states of the arms with respect to the first and second amplifier units. The at least one parallel arm and the at least one series arm are alternately arranged, in the order named, as viewed in the direction from the first amplifier unit to the second amplifier unit.

13 Claims, 16 Drawing Sheets

*Fig. 22*  *Related Art*
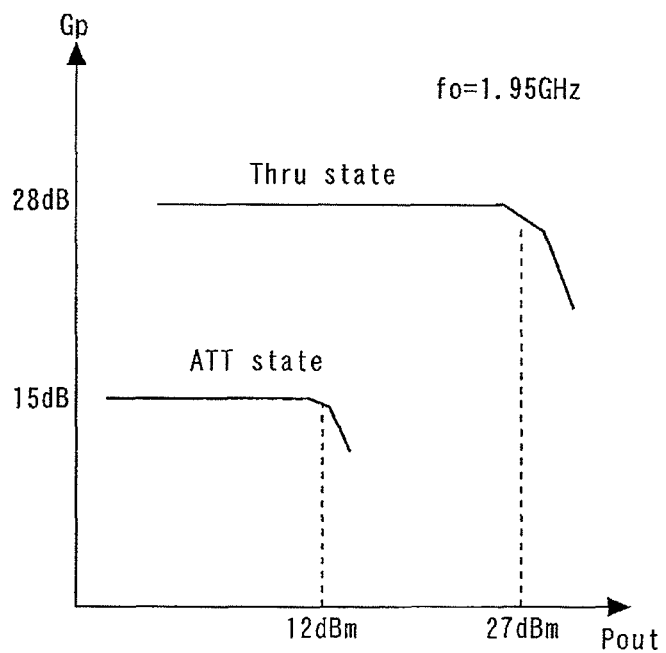
*Fig. 23*  *Related Art*
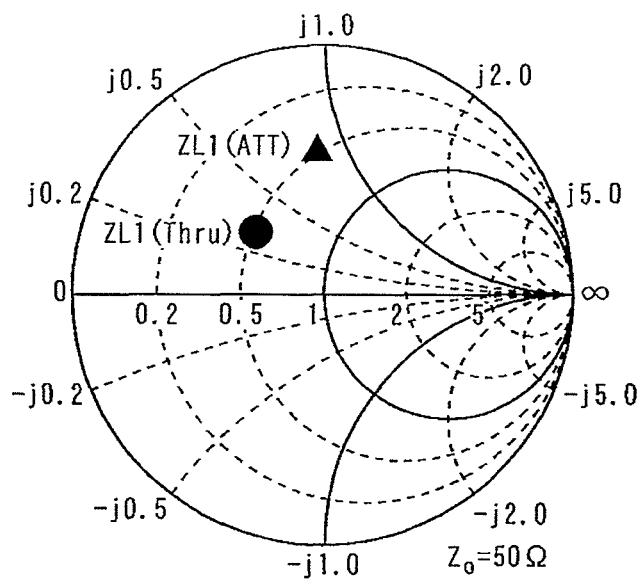

*Fig. 24*                                    Related Art
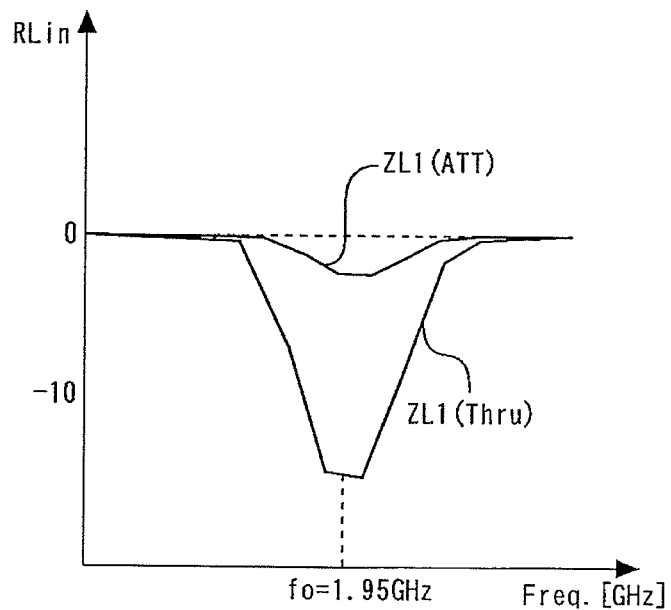
*Fig. 25*                                    Related Art
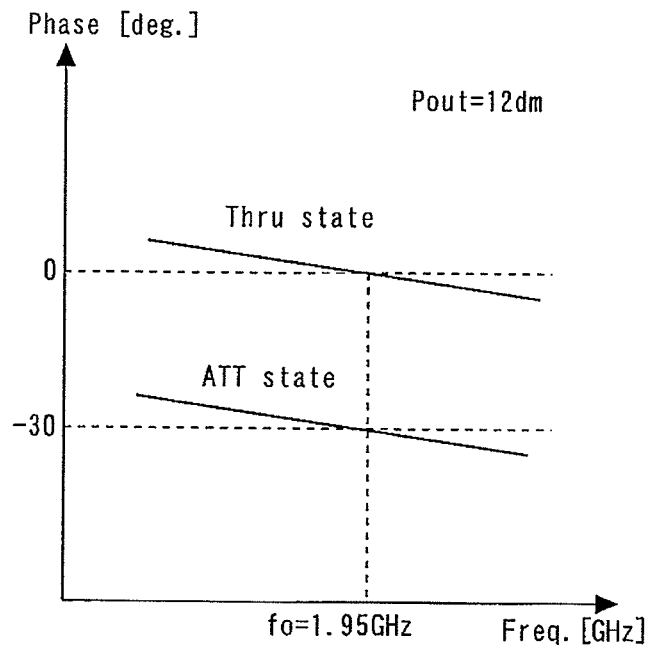

Fig. 26  *Related Art*
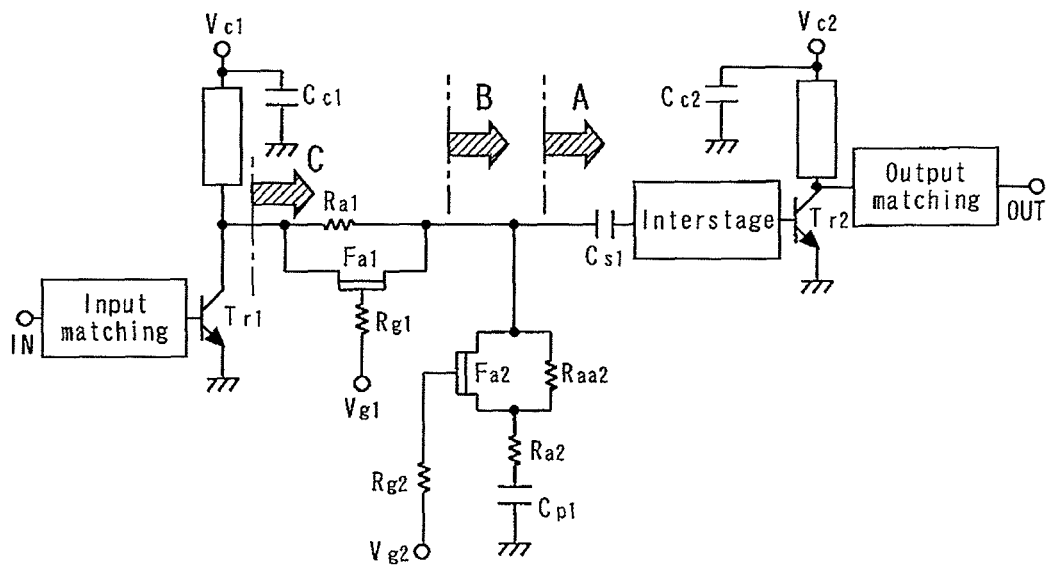
Fig. 27  *Related Art*
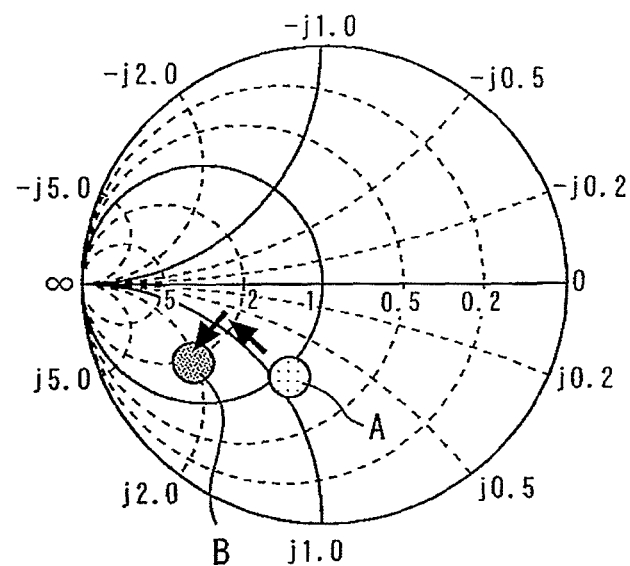

US 8,461,929 B2

POWER AMPLIFIER

FIELD OF THE INVENTION

The present invention relates to a power amplifier and particularly to a high frequency amplifier having a variable gain function.

BACKGROUND ART

High frequency amplifiers having a variable gain function have been known, as disclosed, e.g., in Japanese Laid-Open Patent Publication No. H10-261925. The high frequency amplifier disclosed in this publication includes a variable attenuator provided between the input matching circuit and the first stage amplifier FET (field effect transistor). Specifically, the drain of the bypass FET of this variable attenuator is connected to the gate of the first stage amplifier PET. Further, the gate of the bypass FET is connected to a gain control voltage source through a resistance. According to paragraph [0027] of the publication, the gain control voltage source is controlled so as to vary the drain-source resistance of the bypass FET and thereby vary the amount of attenuation produced by the variable attenuator. In this way the gain of the high frequency amplifier can be varied.

It should be noted that paragraph [0022] of the above publication No. H10-261925 mentions that the configuration of the above high frequency amplifier may be applied to multistage amplifiers. The paragraph further mentions that in such multistage amplifiers, the second stage amplifier FET may be connected to the output side of the first stage amplifier FET.

Other prior art includes Japanese Laid-Open Patent Publication Nos. S62-143507, 2002-171101, and H01-255469.

Power amplifiers are often required to have a gain switching function, as can be seen from the fact that the above prior art provides high frequency amplifiers having a variable gain function. For example, a gain switching function is often required of W-CDMA (wideband code division multiple access) power amplifiers. The reason for this is that when an RF transceiver LSI (radio frequency transceiver large scale integration) is connected to the input side of such a power amplifier, if the gain of the power amplifier is high when the output power level (Pout) of the power amplifier is low, the output power of the RF transceiver LSI often need be reduced by an amount corresponding to the gain of the power amplifier.

In that case, the ratio of the signal level to the noise level decreases unless the noise level at the output of the RF-LSI is sufficiently low, resulting in degradation of the signal-to-noise ratio (SN ratio) of the output signal of the RF-LSI. One effective way to avoid this problem is to reduce the gain of the power amplifier at low output power levels, thereby improving the SN ratio. An attenuator may be used to achieve the function of reducing the gain of the power amplifier. The term "attenuator" may be hereinafter abbreviated as "ATT" for convenience of explanation.

FIG. 20 is a diagram showing an exemplary configuration of a two-stage amplifier having an attenuator. More specifically, FIG. 20 is a block diagram showing a specific GaAs-based power amplifier manufactured by a BiFET or HBT process. Referring to FIG. 20, an ATT is provided between the first stage amplifier and the second stage amplifier. A bias circuit is provided for each of the first and second stage amplifiers. A reference voltage generator (Vref-Generator) generates a reference voltage Vref from a voltage Ven, and this reference voltage Vref is applied to the bias circuits.

If an ATT is provided on the input side of the power amplifier (i.e., on the terminal IN side of the first stage amplifier shown in FIG. 20), when the ATT is in its attenuation state (or ATT state), the noise factor (NF) of the power amplifier is degraded by an amount corresponding to the amount of attenuation. That is, a power amplifier in which an attenuator for gain switching is provided between the input matching circuit and the first stage amplifier (as in the high frequency amplifier disclosed in the above Japanese Laid-Open Patent Publication No. H10-261925) may suffer such noise factor degradation. Further, the present inventor has found that the high frequency amplifier disclosed in the above publication is also disadvantageous in that the phase shift in the amplifier significantly changes when its gain is switched between high and low levels, since the gain switching is accomplished by connecting and disconnecting, by use of a switch, a capacitance provided in the input stage to switch the gain.

The noise factor degradation can be avoided by providing an attenuator between stages, as shown in FIG. 20.

However, as a result of intensive study, the inventor has found that two-stage amplifiers having an attenuator between the stages, as shown in FIG. 20, exhibit increased input reflection loss and an increased change in phase shift therein. That is, when the gain of these amplifiers is switched, the input reflection loss may increase significantly or the phase shift may change significantly, depending on the configuration of the interstage attenuator. The present inventor has found a novel technique that avoids such degradation of the high frequency characteristics by employing an interstage attenuator having a specific configuration.

The present invention has been made to solve the above problems. It is, therefore, an object of the present invention to provide a power amplifier having an attenuator between stages wherein the gain of the power amplifier can be switched while preventing degradation of the input reflection loss therein.

Another object of the present invention is to provide a power amplifier having an attenuator between stages wherein the gain of the power amplifier can be switched while suppressing change in phase shift therein.

Other and further objects, features and advantages of the invention will appear more fully from the following description.

SUMMARY OF THE INVENTION

According to a first aspect of the present invention, a power amplifier includes a first amplifier unit, a second amplifier unit and an attenuator. The second amplifier receives a signal from the first amplifier unit and amplifies the signal. The attenuator is provided between the first and second amplifier units. The attenuator has a plurality of arms including at least one parallel arm and at least one series arm and has switches provided to the plurality of arms to switch the electrical connection states of the plurality of arms with respect to the first and second amplifier units. The at least one parallel arm and the at least one series arm are alternately arranged in the order named as viewed in the direction from the first amplifier unit to the second amplifier unit.

According to a second aspect of the present invention, a power amplifier includes a first amplifier unit a second amplifier unit and an attenuator. The second amplifier unit receives a signal from the first amplifier unit and amplifies the signal. The attenuator is provided between the first and second amplifier units. The attenuator includes a plurality of arms including at least one parallel arm and at least one series arm, switches provided to the plurality of arms to switch the electrical connection states of the plurality of arms with respect to the first and second amplifier units, and a capacitive or inductive element in series with the series arm, the element being provided in a path of a signal attenuated by the attenuator.

In accordance with the first aspect of the present invention there is provided a power amplifier whose gain can be switched while preventing degradation of the input reflection loss therein.

In accordance with the second aspect of the present invention there is provided a power amplifier whose gain can be switched while suppressing change in phase shift therein.

BRIEF DESCRIPTION OF THE DRAWINGS

FIG. 22 is a diagram illustrating various characteristics of the comparative power amplifier shown in FIG. 21.

FIG. 23 is a diagram illustrating various characteristics of the comparative power amplifier shown in FIG. 21.

FIG. 24 is a diagram illustrating various characteristics of the comparative power amplifier shown in FIG. 21.

FIG. 25 is a diagram illustrating various characteristics of the comparative power amplifier shown in FIG. 21.

FIG. 26 is a diagram illustrating the operation of the comparative power amplifier described above with reference to FIG. 21.

FIG. 27 is a diagram illustrating the operation of the comparative power amplifier described above with reference to FIG. 21.

DETAILED DESCRIPTION OF THE PREFERRED EMBODIMENTS

First Embodiment
[Configuration and Operation of First Embodiment]

Figure 1:
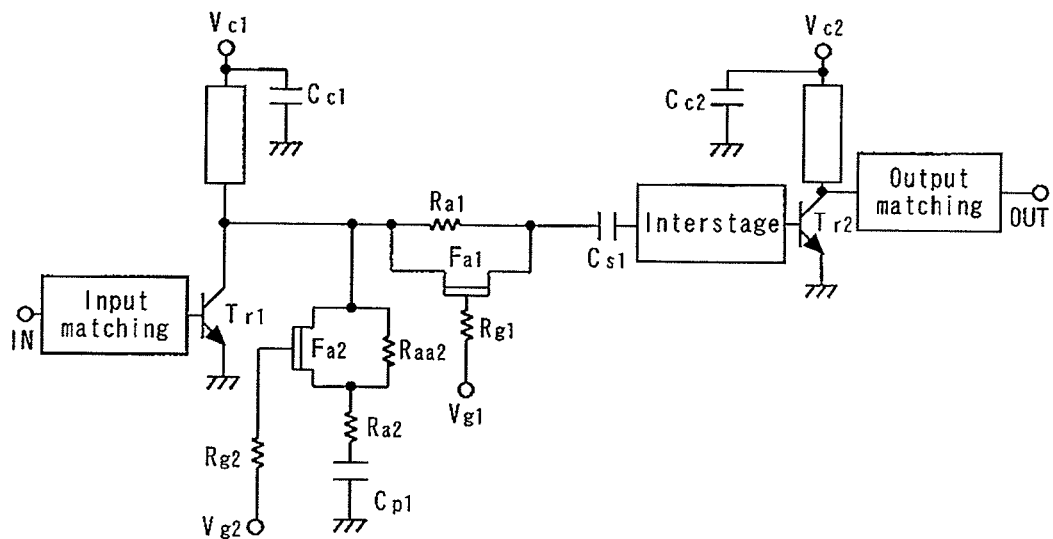
FIG. 1 is a circuit diagram of a power amplifier in accordance with a first embodiment of the present invention.

FIG. 1 is a circuit diagram of a power amplifier in accordance with a first embodiment of the present invention. The power amplifier of the first embodiment, like the power amplifier of FIG. 20, includes an attenuator provided between the first and second stage amplifiers. For example, an attenuator provided between amplifiers, i.e., between the output terminal of an amplifier and the input terminal of the following amplifier, may be hereinafter referred to as an "interstage attenuator," for convenience. The attenuator of the power amplifier of the first embodiment may be a step attenuator (or step ATT) such as that provided between the stages of the two-stage amplifier shown in FIG. 20. Specifically, FIG. 1 is a circuit diagram of a power amplifier with gain switching capability having a step attenuator between stages. It should be noted that the bias circuits are omitted from the circuit diagram of FIG. 1.

The attenuation state of an attenuator may be hereinafter referred to as the "ATT state" of the attenuator, for convenience. The amplifier circuit configurations shown in FIGS. 20 and 1, in which an attenuator is provided between stages, can avoid the problem associated with conventional amplifier circuit configurations in which an attenuator is provided on the input side of the first stage amplifier, that is, they can avoid the situation where the noise factor (NF) of the power amplifier is reduced by an amount corresponding to the amount of attenuation when the attenuator is in the ATT state.

The symbols in FIG. 1 indicate the following components.

In FIG. 1, the reference symbols IN and OUT denote RF input and output terminals, respectively, and Tr1 and Tr2 denote HBTs (heterojunction bipolar transistors). In FIG. 1, the reference symbols Fa1 and Fa2 denote FETs (field effect transistors). In accordance with the present embodiment, Fa1 and Fa2 are D-mode (depression mode: normally off) FETs. Further in FIG. 1, the reference symbols Cc1 and Cc2 denote decoupling capacitances; Vc1 and Vc2 denote the collector power supply terminals for the power stage transistors Tr1 and Tr2, respectively; Ra1, Ra2, Raa2, Rg1, and Rg2 denote resistances; Cs1 denotes an interstage matching capacitance; Cp1 denotes the parallel capacitance of the attenuator; and Vg1 and Vg2 denote the control terminals of the attenuator. Further, "Input-matching" in FIG. 1 means "input matching circuit," and "Output-matching" means "output matching circuit." These input and output matching circuits provide impedance matching. Further, "Interstage" in FIG. 1 means "interstage matching circuit."

Currently, GaAs-HBT power amplifiers are widely used as cellular phone power amplifiers for CDMA, etc., and as wireless LAN power amplifiers. The GaAs-HBT process can provide power amplifiers which do not require a negative gate bias voltage such as that required by conventional GaAs-FET power amplifiers having a negative threshold voltage and which hence can be operable with a single power supply, and which have more uniform device characteristics than FET-based power amplifiers. Therefore, recently, GaAs-HBT processes are often used to form power amplifiers for cellular phones and for wireless LAN. In accordance with the first embodiment, the transistors Tr1 and Tr2 are formed by a GaAs-HBT process in order to capitalize on the advantages of the process.

Further, more recently, after the GaAs-HBT process has come into use, the BiFET process has begun to be used to manufacture products. The BiFET process is used to manufacture GaAs-HBTs and FETs on the same substrate. Therefore, the first embodiment also uses a BiFET process. It should be noted that a GaAs-based BiFET process typically forms HBTs and D-mode FETs on a substrate. Therefore, in accordance with the first embodiment, Fa1 and Fa2 are D-mode FETs. Although FIG. 1 is a circuit diagram and does not specifically show the structure of the substrate, in accordance with the first embodiment the HBTs Tr1 and Tr2 and the D-mode FETs Fa1 and Fa2 are mounted on the same semiconductor substrate.

The power amplifier of the first embodiment includes a step attenuator, as described above, and in accordance with the first embodiment this step attenuator is an L-type attenuator. The L-type attenuator has a series arm and a parallel arm which each include a resistance. The series arm is inserted in series between the HBTs Tr1 and Tr2. The parallel arm is connected in parallel with Tr1 and Tr2; specifically, one end of the parallel arm is connected to the line between Tr1 and Tr2, and the other end is connected to ground. In accordance with the first embodiment, the series and parallel arms of the attenuator are provided with the switches (or FETs) Fa1 and Fa2, respectively. The electrical states of the arms are switched by turning on and off these switches so that the attenuator is switched between the ATT state (or attenuation state) and the non-attenuation state (or pass-through state). Thus, the power amplifier has gain switching capability.

Referring to FIG. 1, in the power amplifier of the first embodiment, the circuit portion consisting of the components Ra1, Fa1, Rg1, and Vg1 corresponds to the series arm of the L-type attenuator. The series arm is inserted in series between Tr1 and Tr2. Further, in the power amplifier of the first embodiment, the circuit portion consisting of the components Raa2, Fa2, Ra2, Cp1, Rg2, and Vg2 corresponds to the parallel arm of the L-type attenuator.

One terminal of the capacitance Cp1 is connected to ground, and the other terminal of Cp1 is connected to one terminal of the resistance Ra2. Further, Ra2 and Cp1 are connected in series with each other, and the other terminal of Ra2 is connected to the switch Fa2 and the resistance Raa2. The switch Fa2 and the resistance Raa2 are connected in parallel to each other. The gate of Fa2 is connected to the control terminal Vg2 through the resistance Rg2. The resistance Ra1 is inserted in series between Tr1 and Tr2. The switch Fa1 is connected in parallel to the resistance Ra1, as shown in FIG. 1. The gate terminal of Fa1 is connected to the control terminal Vg1 through the resistance Rg1.

The interstage matching capacitance Cs1 is connected in series between the series arm and the interstage matching circuit (Interstage). The input matching circuit (Input-matching) is connected between the RF input terminal IN and the base terminal of Tr1. The output matching circuit (Output-matching) is connected between the RF output terminal OUT and the output side (collector terminal) of Tr2. The interstage matching circuit (Interstage) is connected between Cs1 and the base terminal of Tr2.

In FIG. 1, the parallel arm of the attenuator is connected in parallel to the first stage transistor Tr1, i.e., connected between the collector of Tr1 and the ground GND. In accordance with the first embodiment, the gain of the power amplifier is switched in the following manner. When the voltage at Vg1 is equal to the voltage at Vc1 (=3.4 V) and the voltage at Vg2 is 0 V, Fa1 is turned on and Fa2 is turned off, that is, the attenuator is in the pass-through state (i.e., it passes the signal therethrough without attenuation). When the voltage at Vg1 is 0 V and the voltage at Vg2 is equal to the voltage at Vc1 (=3.4 V), on the other hand, Fa1 is turned off and Fa2 is turned on, so that the RF signal is attenuated by the resistances Ra1 and Ra2, that is, the attenuator is in the attenuation state (or the ATT state).

[Advantages of First Embodiment]

Advantages of the power amplifier of the first embodiment will be described in comparison with the comparative example shown in FIGS. 21 to 25. It should be noted that the circuit diagram of the comparative example shown in FIG. 21 and other figures and the following description are provided to illustrate the advantages of the first embodiment. They are only used to illustrate ideas conceived by the present inventor as a result of intensive study, and the techniques described therein are provided just as comparative examples for description of the first embodiment.

(Description of Comparative Example)

W-CDMA (wideband code division multiple access) power amplifiers are often required to have a gain switching function. The reason for this is that if the gain of a W-CDMA power amplifier is high when its output power level (Pout) is low, the output power of the RF transceiver LSI connected to the input side of the power amplifier often need be reduced. Specifically, if the gain of the power amplifier is 27 dB or higher when its output power level Pout is lower than 12 dBm, then it is necessary to reduce the output power of the RF transceiver LSI by an amount corresponding to the gain of the power amplifier.

For example, when the output power level Pout of the power amplifier is −40 dBm and the gain is 28 dB, the output power of the RF-LSI is −68 dB. In this case, the ratio of the signal level to the noise level decreases if the noise level at the output of the RF-LSI is not sufficiently low, resulting in degradation of the signal-to-noise ratio (SN ratio) of the output signal of the RF-LSI. One effective way to avoid this problem is to reduce the gain of the power amplifier at low output power levels.

Figure 20:
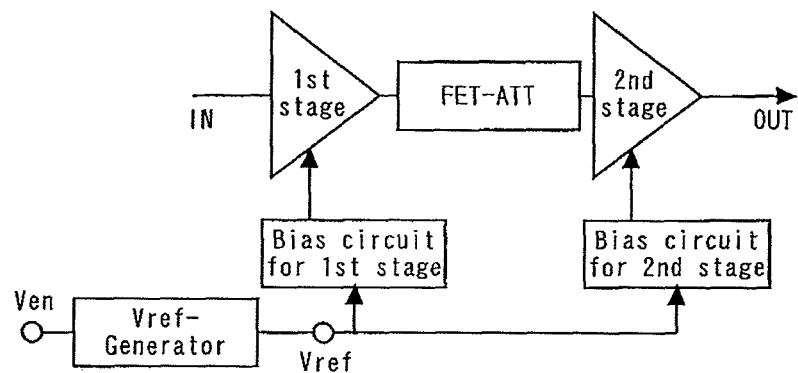
FIG. 20 is a diagram showing an exemplary configuration of a two-stage amplifier having an attenuator.
Figure 21:
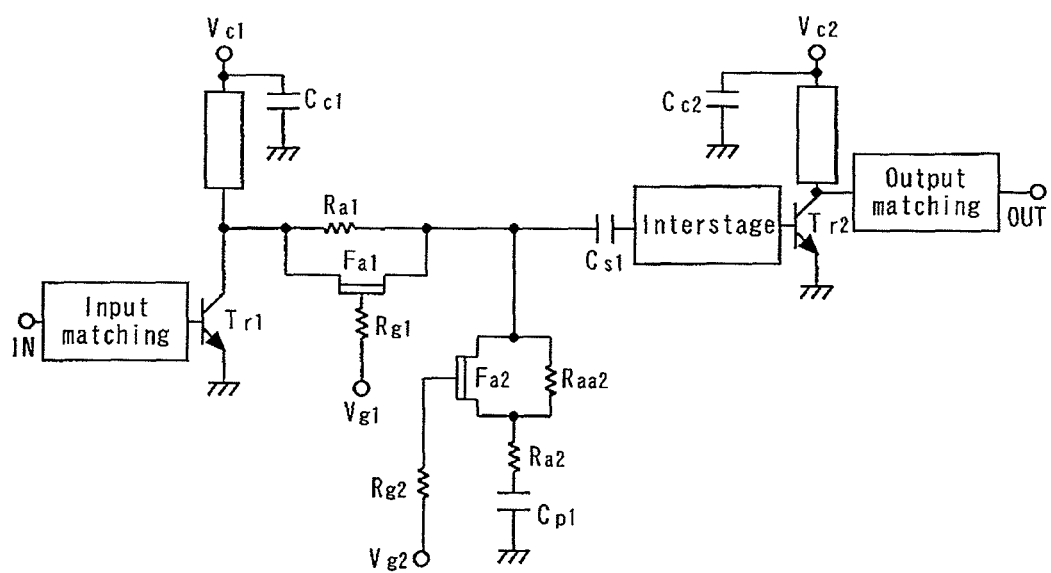
FIG. 21 shows an exemplary comparative circuit configuration of a power amplifier which will be described in comparison to the power amplifier of the first embodiment, wherein this comparative power amplifier, like the power amplifier shown in FIG. 20, includes a step attenuator (step ATT) between the stages.

FIG. 21 shows an exemplary comparative circuit configuration of a power amplifier which will be described in comparison to the power amplifier of the first embodiment, wherein this comparative power amplifier, like the power amplifier shown in FIG. 20, includes a step attenuator (step ATT) between the stages. The bias circuits are omitted from FIG. 21. In FIG. 21, parts corresponding to those in FIG. 1 bear the same reference symbols. Specifically, the reference symbols IN and OUT denote RF input and output terminals, respectively; Tr1 and Tr2, HBTS; Fa1 and Fa2, D-mode FETs; Cc1 and Cc2, decoupling capacitances; Vc1 and Vc2, collector power supply terminals for the power stage transistors Tr1 and Tr2, respectively; Ra1, Ra2, Raa2, Rg1, and Rg2, resistances; Cs1, an interstage matching capacitance; Cp1, the parallel capacitance of the attenuator; and Vg1 and Vg2, the control terminals of the attenuator.

In the comparative power amplifier shown in FIG. 21, when the voltage at Vg1 is equal to the voltage at Vc1 (=3.4 V) and the voltage at Vg2 is 0 V, Fa1 is turned on and Fa2 is turned off, that is, the attenuator is in the pass-through state (or Thru state). When the voltage at Vg1 is 0 V and the voltage at Vg2 is equal to the voltage at Vc1, on the other hand, Fa1 is turned off and Fa2 is turned on, so that the output power from Tr1 is attenuated by Ra1 and Ra2, that is, the attenuator is in the attenuation state (or ATT state).

It should be noted that since in the power amplifier shown in FIG. 21 the attenuator is provided between the stages, the power amplifier also avoids the problem associated with conventional configurations in which the attenuator is provided on the input side of the amplifier. That is, the power amplifier configuration shown in FIG. 21 can also avoid the situation where the noise factor (NF) of the power amplifier is reduced by an amount corresponding to the amount of attenuation (13 dB in this comparative example) when the attenuator is in the ATT state.

FIGS. 22 to 25 are diagrams illustrating various characteristics of the comparative power amplifier shown in FIG. 21. FIG. 22 is a diagram showing an exemplary output power Pout vs. gain Gp characteristic of the power amplifier. FIG. 23 is a diagram showing an exemplary load impedance of the HBT Tr1 shown in FIG. 21. FIG. 24 is a diagram showing an exemplary reflection loss characteristic at the input end (IN). FIG. 25 shows the phase characteristics of the power amplifier in the Thru and ATT states shown in FIG. 22.

FIG. 22 shows the gain (Gp) of the power amplifier as a function of the output power (Pout) for both the pass-through and attenuation states of the attenuator, indicating the maximum output power that can be produced by the power amplifier when the attenuator is in each state. The reflection loss Rlin at the input end of the power amplifier is greatly degraded when the attenuator is in the attenuation state, as shown in FIG. 24. This results from the fact that the load impedance of Tr1 changes significantly when the attenuator is switched from the Thru state to the ATT state (attenuation state), as shown in FIG. 23. This change in the load impedance affects the input side of Tr1 through the base-collector capacitance of Tr1, resulting in a change in the input reflection loss.

It should be noted that the phase shift in the power amplifier changes by approximately −30° when the attenuator is switched from the pass-through state to the attenuation state, as shown in FIG. 25. This means that, during the course of its operation, the power amplifier may produce a phase shift which is not within the range of ±30° as required by W-CDMA. systems, since the components of the power amplifier may have variations in their characteristics. That is, the amount of change in phase shift in the power amplifier when the attenuator is switched between the pass-through and attenuation states is too large. It should be noted that although in the example of FIG. 25 the phase shift in the power amplifier when the attenuator is in the attenuation state is shown to lag that when the attenuator is in the pass-through state, the phase shift in the power amplifier when the attenuator is in the attenuation state may lead that when the attenuator is in the pass-through state, depending on the configurations and the parameter settings of the input, interstage, and output matching circuits. Ideal attenuators do not cause any change in phase shift in the power amplifier when they are switched between the pass-through and attenuation states. However, practical attenuators cause some change in the phase shift.

(Characteristics of First Embodiment and Comparison of Advantages of First Embodiment Versus Comparative Example)

Figure 2:
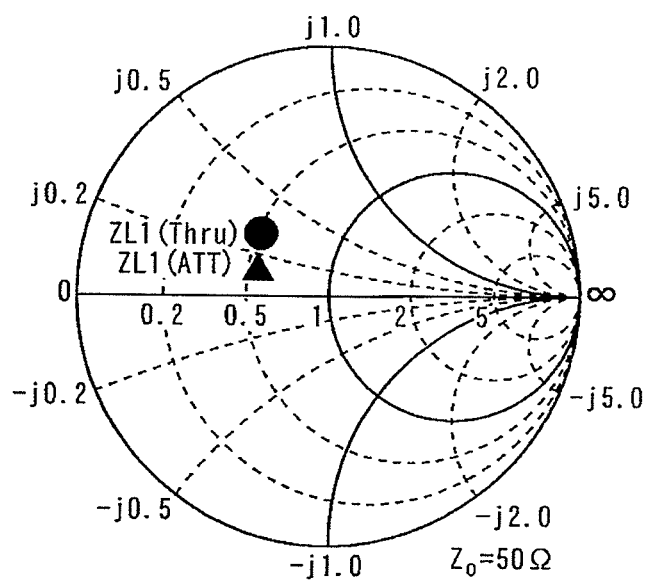
FIG. 2 is a diagram illustrating various characteristics of the power amplifier of the first embodiment of the present invention.
Figure 3:
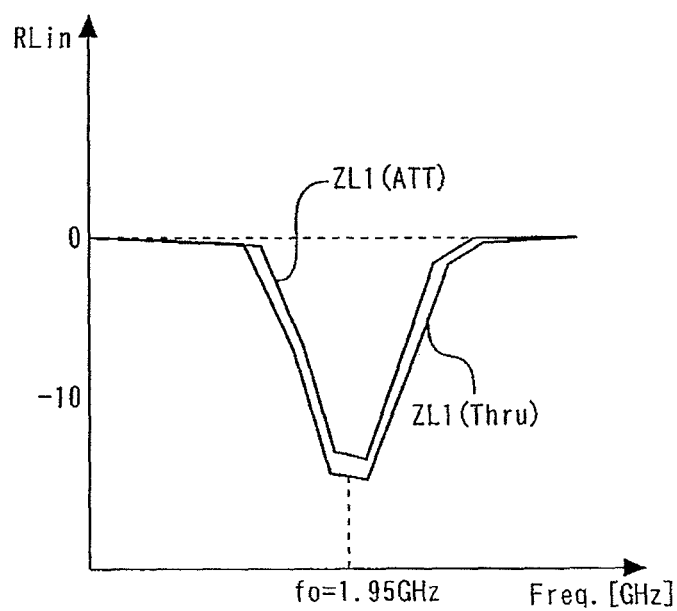
FIG. 3 is a diagram illustrating various characteristics of the power amplifier of the first embodiment of the present invention.
Figure 4:
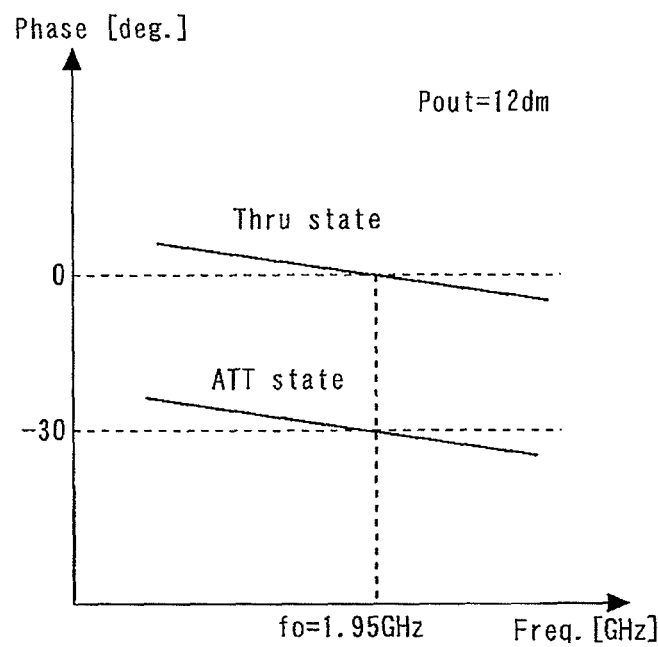
FIG. 4 is a diagram illustrating various characteristics of the power amplifier of the first embodiment of the present invention.

FIGS. 2 to 4 are diagrams illustrating various characteristics of the power amplifier of the first embodiment. FIG. 2 is a diagram showing the load impedance of the first stage transistor Tr1 of the power amplifier of the first embodiment, in which the ATT (attenuator) is connected to the output of the first stage. FIG. 3 is a diagram showing the reflection loss at the input of the power amplifier of the first embodiment. FIG. 4 is a diagram showing the phase characteristics of the power amplifier of the first embodiment.

Comparison of FIGS. 2 to 4 with FIGS. 22 to 25 reveals the following: As shown in FIG. 2, in the power amplifier of the first embodiment, the change in the load impedance of the first stage transistor Tr1 when the gain of the power amplifier is switched is significantly reduced as compared to the comparative power amplifier. As a result, it is possible to prevent degradation of the input reflection loss in the power amplifier when its gain is switched, as shown in FIG. 3.

As described above, the power amplifier of the first embodiment includes an L-type attenuator whose parallel arm is connected to the output of the first stage transistor Tr1 of the amplifier, making it possible to switch the gain of the power amplifier while preventing degradation of the input reflection loss therein. Specifically, in the power amplifier of the first embodiment, the parallel arm and the series arm of the interstage L-type attenuator are arranged in the order named as viewed in the direction from the first stage transistor Tr1 to the second stage transistor Tr2. (That is, the series arm of the L-type attenuator is connected in series between the output of Tr1 and the input side of Tr2, and the parallel arm of the L-type interstage attenuator is connected to the input end of the series arm, i.e., connected to the output of the first stage transistor Tr1) In the comparative power amplifier, on the other hand, the series arm and the parallel arm of the L-type attenuator are arranged in the order named (i.e., the parallel arm of the L-type attenuator is connected to the output end of the series arm). The configuration of the power amplifier of the first embodiment, unlike that of the comparative power amplifier, makes it possible to switch the gain of the amplifier while preventing degradation of the input reflection loss therein.

Thus, the comparative power amplifier cannot maintain good input reflection loss characteristics when its attenuator is turned on and off (i.e., its gain is switched). The present inventor found this fact when designing a two-stage amplifier which is manufactured by a BiFET process and which maintains good input reflection loss characteristics even when its attenuator is turned on and off.

Especially, in the case of an HBT amplifier, since the HBTs have a large base-collector capacitance when they are in the power mode, a large amount of RF signal is fed back from the collector to the base terminal. This makes it very difficult for the amplifier to maintain good input reflection loss characteristics. This fact is not widely known and was found by the present inventor.

[Operation of Power Amplifier of First Embodiment]

The operation of the power amplifier of the first embodiment will be described in detail with reference to FIGS. 26 to 31. Specifically, in the power amplifier, the parallel arm and the series arm of the attenuator are arranged in the order named as viewed in the direction from the first stage transistor Tr1 to the second stage transistor Tr2; that is, in accordance with the first embodiment, the parallel arm is connected to the output of the first stage transistor Tr1, instead of to the output end of the series arm. The following describes the way in which this configuration reduces the change in the load impedance of Tr1 when the gain of the power amplifier is switched, as shown in FIG. 2.

Figure 28:
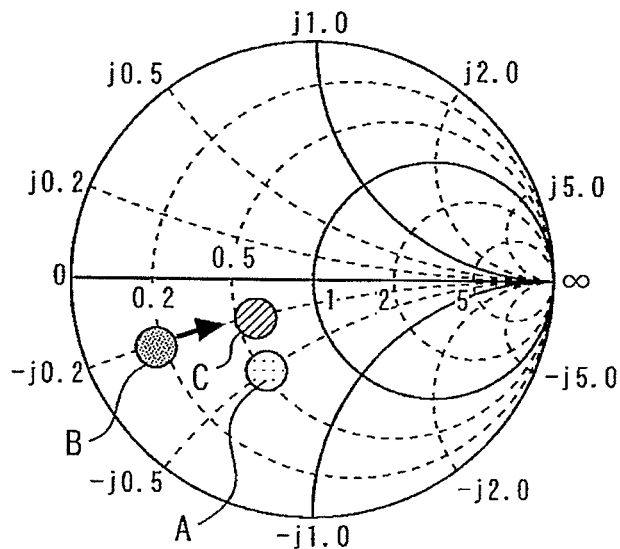
FIG. 28 is a diagram illustrating the operation of the comparative power amplifier described above with reference to FIG. 21.
Figure 29:
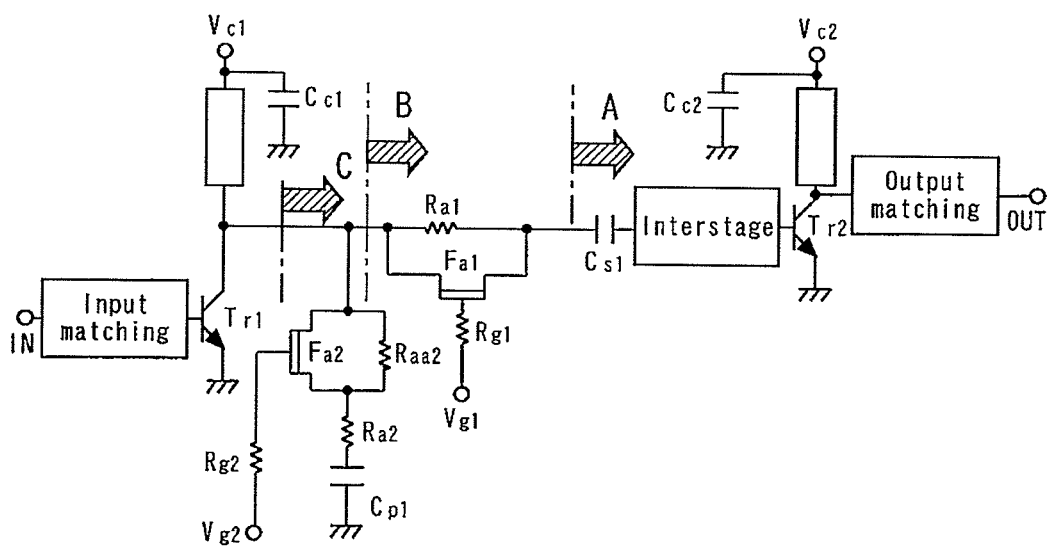
FIG. 29 is a diagram illustrating the operation of the power amplifier in accordance with the first embodiment of the present invention.
Figure 30:
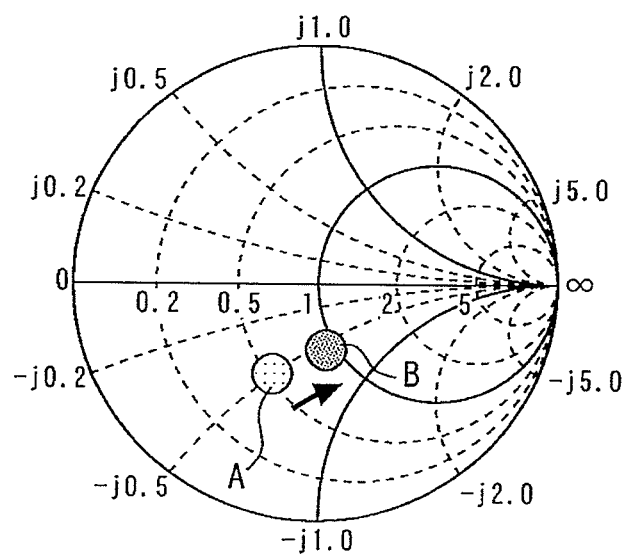
FIG. 30 is a diagram illustrating the operation of the power amplifier in accordance with the first embodiment of the present invention.
Figure 31:
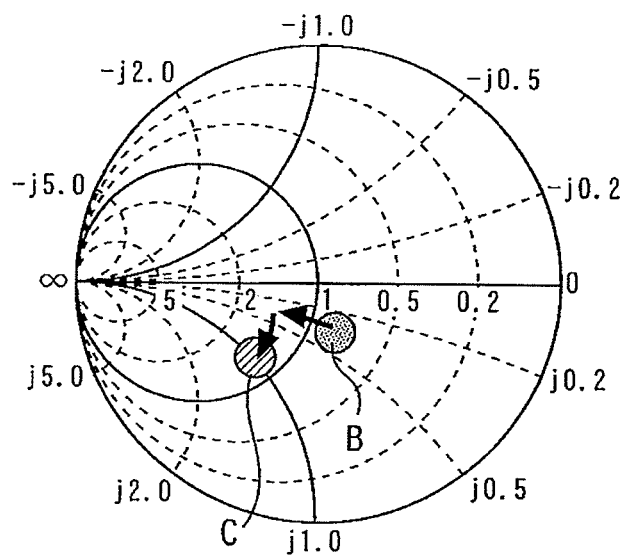
FIG. 31 is a diagram illustrating the operation of the power amplifier in accordance with the first embodiment of the present invention.

The operation of the power amplifier of the first embodiment will be described by comparison with the comparative power amplifier shown in FIG. 21. FIGS. 26 to 28 are diagrams illustrating the operation of the comparative power amplifier described above with reference to FIG. 21. FIGS. 29 to 31, on the other hand, are diagrams illustrating the operation of the power amplifier of the first embodiment described above with reference to FIG. 1. It should be noted that FIGS. 27 and 28 show the impedances at selected locations A, B, and C in FIG. 26 as seen looking in the directions of the respective arrows, and FIGS. 30 and 31 show the impedances at selected locations A, B, and C in FIG. 29 as seen looking in the directions of the respective arrows. As shown, the impedances at these locations A, B, and C differ from each other. It should be noted that FIGS. 27 and 28 show impedances in the power amplifier of FIG. 26 when its attenuator is turned on (i.e., the attenuator is in the attenuation state), and FIGS. 30 and 31 show impedances in the power amplifier of FIG. 29 when its attenuator is turned on.

(Operation of Comparative Example)

FIG. 26 shows the circuit of the comparative power amplifier described above with reference to FIG. 21. FIGS. 27 and 28 show the impedances at locations A, B, and C in the power amplifier of FIG. 26 (as seen looking in the directions of the respective arrows) when the attenuator is turned on. As shown, these impedances differ from one another.

Referring to FIGS. 26 and 27, point A in FIG. 27 represents the impedance at location A in FIG. 26, and point B in FIG. 27 represents the impedance at location B in FIG. 26. As shown in FIG. 27, point B is located away from point A as a result of the presence of the parallel arm consisting of the FET Fa2, the resistance Ra2, and the finite capacitance Cp1. Further, referring to FIGS. 26 and 28, point C in FIG. 28 represents the impedance at location C in FIG. 26. As a result of the presence of the series arm consisting of the FET Fa1 and the resistance Ra1, point C is located away from point B, as shown in FIG. 28. When the attenuator is turned off (i.e., it is in the pass-through state), on the other hand, the impedance at location C in FIG. 26 can be represented by point A, not point C, in FIGS. 27 and 28 if the on-resistance of the FET is ignored. (That is, when the attenuator is turned off, the impedance at location C is substantially the same as that at location A.)

This means that in the comparative power amplifier of FIG. 26, the load impedance of the first stage transistor Tr1 when the attenuator is turned on is represented by point C in FIG. 28, and the load impedance of the first stage transistor Tr1 when the attenuator is turned off is represented by point A in FIG. 28 (or FIG. 27). These load impedances significantly differ from each other, as shown in FIG. 28.

(Operation of First Embodiment)

On the other hand, FIG. 29 shows the circuit of the power amplifier of the first embodiment (i.e., the circuit configuration shown in FIG. 1). FIGS. 30 and 31 show the impedances at selected locations A, B, and C in the power amplifier of FIG. 29 (as seen looking in the directions of the respective arrows) when the attenuator is turned on. As shown, these impedances differ from one another.

Referring to FIGS. 29 and 30, point A in FIG. 30 represents the impedance at location A in FIG. 29, and point B in FIG. 30 represents the impedance at location B in FIG. 29. As shown in FIG. 30, point B is located away from point A as a result of the presence of the parallel arm. Further, referring to FIGS. 29 and 31, point C in FIG. 31 represents the impedance at location C in FIG. 29. As a result of the presence of the series arm, point C is located away from point B, as shown in FIG. 31. However, in the charts (shown in FIGS. 30 and 31), point C is located at substantially the same location as point A, since the parallel arm and the series arm of this attenuator configuration have opposite effects on the load impedance of the first stage transistor Tr1.

Thus, in the charts of FIGS. 27 and 28, which show the impedances at selected locations in the comparative power amplifier, point C is located away from point A. On the other hand, in the charts of FIGS. 30 and 31, which show the impedances at selected locations in the power amplifier of the first embodiment, point C is located at substantially the same location as point A. This difference results from the fact that in the power amplifier of the first embodiment, the parallel arm of the attenuator is connected to the input end of the series arm, i.e., connected to the output of the first stage transistor Tr1, whereas in the comparative power amplifier the parallel arm of the attenuator is connected to the output end of the series arm. That is, in the power amplifier of the first embodiment, the parallel arm and the series arm of the attenuator are arranged in the order named as viewed in the direction from the first stage transistor Tr1 to the second stage transistor Tr2. It should be noted that in both the power amplifier of the first embodiment and the comparative power amplifier, the impedance at location C when the attenuator is turned off is substantially the same as that at location A. That is, the impedance at location C in FIG. 29 is substantially the same both when the attenuator is turned on and when it is turned off. Therefore, in the power amplifier of the first embodiment, it is possible to prevent a change in the load impedance of the first state transistor Tr1 when the attenuator is turned on and off. As a result, it is possible to prevent a change in the input reflection loss in the power amplifier when the attenuator is turned on and off.

It should be noted that in the first embodiment described above, the first stage amplifier including the first stage transistor Tr1 corresponds to the first amplifier unit of the first aspect of the invention described in the Summary of the Invention section, and the second stage amplifier including the second stage transistor Tr2 corresponds to the second amplifier unit of the first aspect. Further in the first embodiment described above, the L-type attenuator (a step attenuator) shown in the circuit diagram of FIG. 1 corresponds to the attenuator of the first aspect of the invention; the series arm consisting of the FET Fa1, the resistances Ra1 and Rg1, and the control terminal Vg1 shown in FIG. 1 corresponds to the series arm of the first aspect; and the parallel arm consisting of the FET Fa2, the resistances Raa2, Ra2, and Rg2, the capacitance Cp1, and the control terminal Vg2 corresponds to the parallel arm of the first aspect.

[Variations of First Embodiment]

Although the first embodiment uses an L-type attenuator, it is to be understood that the present invention is not limited to this particular type of attenuator. Other embodiments of the invention may use a Π (pi) type attenuator. In this case, one parallel arm, the series arm, and the other parallel arm of the Π-type attenuator may be arranged in the order named as viewed in the direction from the first stage transistor Tr1 to the second stage power transistor Tr2. This results in the situation where the load impedance of Tr (i.e., the impedance at location C in FIG. 29) when the attenuator is turned on is substantially equal to that when the attenuator is turned off.

It should be noted that the power amplifier of the first embodiment described above has phase characteristics as shown in FIG. 4. The phase shift in the power amplifier when the attenuator is in the ATT state can be limited to some extent by increasing the capacitance Cp1 and suitably selecting the values of the resistances Ra1 and Ra2, the gate widths of the FETs Fa1 and Fa2, and the interstage matching factor. For example, the phase shift can be reduced to a maximum of 10-20° (acceptable values are less than 30°). Therefore, in accordance with the first embodiment, one or more of the value of the capacitance Cp1, the values of the resistances Ra1 and Ra2, the gate widths of the FETs Fa1 and Fa2, and the interstage matching factor may be selected so as to limit the phase shift in the power amplifier to a maximum of approximately 10-20°. Especially, the phase shift can be effectively restricted by increasing Cp1. Therefore, the value of Cp1 may be such that the phase shift in the power amplifier is limited to a maximum of approximately 10-20°.

The power amplifier of the first embodiment is a two stage power amplifier. It is to be understood, however, that the present invention is not limited to this particular type of amplifier. The present invention may be applied to multistage amplifiers having three or more stages. Specifically, the present invention may be applied to a three stage amplifier having the third stage amplifier circuit in addition to the first and second stage amplifier circuits. (For example, like the amplifier transistors Tr1 and Tr2 of the first and second stage amplifier circuits, the amplifier transistor of the third stage amplifier circuit may be a GaAs-HBT.) That is, the present invention can be applied to multistage amplifiers having any desired number of stages (three stages or more). In such cases, the parallel arm and the series arm of the interstage attenuator may be arranged in the order named as viewed in the direction from the input stage to the output stage, as in the first embodiment.

It should be noted that the present inventor has found that in the case of three-stage amplifiers (e.g., BiFET three-stage amplifiers), an attenuator (FET-ATT) such as that of the first embodiment is preferably provided between the first and second stages. If the attenuator is provided between the second and third stages, the resulting input reflection loss prevention effect (i.e., the effect of preventing degradation of the input reflection loss when the gain of the power amplifier is switched) is very small, as compared to when the attenuator is provided between the first and second stages. The reason for this is that in that case, a change in the input impedance of the second stage power HBT has only a very low impact on the input reflection loss in the first stage power HBT. Therefore, in the case of three-stage amplifiers (e.g., BiFET three-stage amplifiers), an attenuator (FET-ATT) such as that of the first embodiment is preferably provided between the first and second stages.

The power amplifier of the first embodiment can be switched between two gain levels and includes a step attenuator. It is to be understood, however, that the present invention is not limited to this particular type of amplifier. The circuit configuration of the first embodiment described above in the Operation of First Embodiment section functions to prevent a change in the load impedance of the first stage transistor Tr1 even if the attenuator is replaced by a variable attenuator. That is, the amount of attenuation produced by the attenuator may be continuously varied from the ON level to the OFF level (or zero) and from the OFF level to the ON level, instead of being switched between the ON and OFF levels, so as to prevent a change in the input reflection loss. Accordingly, the first embodiment may be applied to power amplifiers whose gain is switched among two or more levels or varied continuously. In such cases, as in the first embodiment, the parallel arm of the attenuator may be connected to the output of the first stage transistor (or the output of the input stage) to achieve the advantages of the present invention.

The first embodiment uses two HBT amplifiers including the HBTs Tr1 and Tr2, respectively. It is to be understood, however, that the present invention is not limited to HBT amplifiers. The present invention may be applied to FET amplifiers. That is, Tr1 and Tr2 may be replaced by FET amplifiers. However, when in operation, HET amplifiers have a larger base-collector capacitance than FET amplifiers, and therefore the present invention is more effective when applied to HBT amplifiers. Further, although in the first embodiment the transistors Tr1 and Tr2 are GaAs-HBTs, it is to be understood that they may be SiGe-HBTs.

It should be note that in accordance with the present embodiment the input matching circuit may include two capacitors (Cin1, Cin2) and an inductor device (Lint), as shown in FIG. _. On the other hand, the output matching circuit may include two inductor devices (L21, L22) and three capacitances (C21, C22, C23). The interstage matching circuit may include two capacitances (Cint3, Cint4) and one inductor device (Lint2).

However, many different circuit configurations can be designed for the input, output, and interstage matching circuits. Therefore, the configurations of the input, output, interstage matching circuits used in the power amplifier of the present invention are not limited to those described above.

The present invention has been described in connection with application to W-CDMA (wideband code division multiple access) systems and cellular phones. The reason is that cellular phone systems such as W-CDMA and LTE systems are typical systems in which it is important to prevent a change in input reflection loss and in phase shift in the amplifiers when the attenuator is turned on and off. It is to be understood, however, that the power amplifier of the present invention is not limited to the use in cellular phones. Various systems, such as satellite communication systems, which require prevention of a change in input reflection loss and in phase shift in the power amplifiers utilize a linear digital modulation system, as do cellular phones. The present invention is also effective when applied to these systems.

Second Embodiment

The gain of the power amplifier of the first embodiment can be switched between high and low levels while preventing degradation of the input reflection loss therein. However, the phase shift in the power amplifier (or the phase characteristics of the power amplifier) changes when its gain is switched. The phase characteristics of the power amplifier of the first embodiment are similar to those of the comparative power amplifier described with reference to FIGS. 21 to 25 (both when the attenuator is in the attenuation state and when it is in the pass-through state). FIG. 4 shows the phase characteristics of the power amplifier of the first embodiment, which are similar or identical to those shown in FIG. 25. The phase shift in the power amplifier when the attenuator is in the ATT state can be limited to some extent by increasing the capacitance Cp1 and suitably selecting the values of the resistances Ra1 and Ra2, the gate widths of the FETs Fa1 and Fa2, and the interstage matching factor. The phase shift can be effectively restricted by increasing Cp1. However, it is often necessary that the value of Cp1 be 100 pF or more, which is not practical since formation of such a large capacitance on the IC results in increased cost. Therefore, there is a need for a practical method for limiting the phase shift which can be implemented on an MMIC. In view of this, a second embodiment of the present invention provides a power amplifier whose gain can be switched while preventing a change in phase shift therein.

[Configuration of Second Embodiment]

Figure 5:
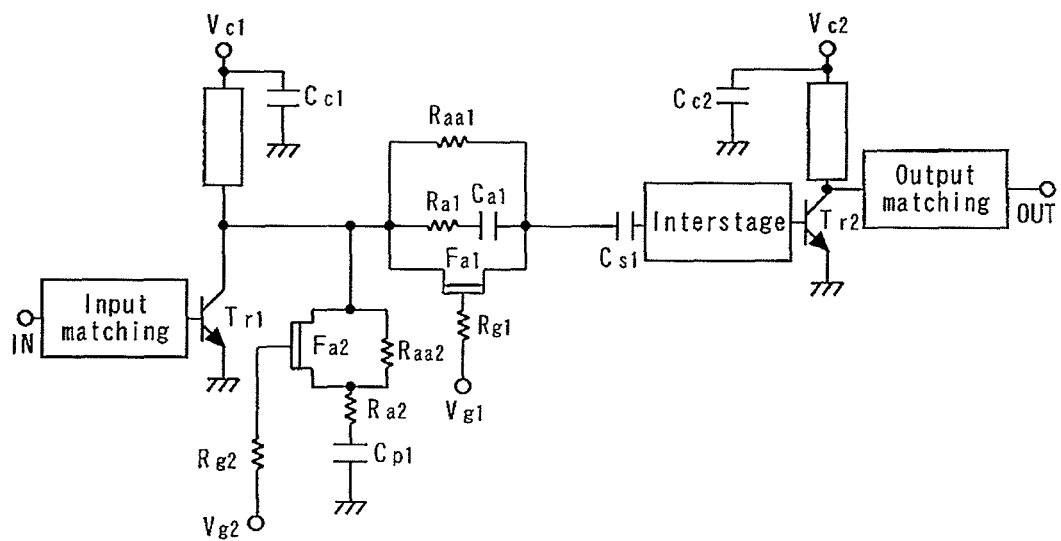
FIG. 5 is a circuit diagram of a power amplifier in accordance with a second embodiment of the present invention.

FIG. 5 is a circuit diagram of a power amplifier of the second embodiment. Specifically, FIG. 5 is a circuit diagram showing a power amplifier having an attenuator which includes a capacitor for compensating for the phase shift in the amplifier. A capacitance for compensating for the phase shift is also hereinafter referred to as a "phase shift compensation capacitance." More specifically, FIG. 5 shows the circuit configuration of a power amplifier with gain switching capability having a step attenuator between stages. In the power amplifier of the second embodiment, a capacitance Ca1 is provided in series to the resistance Ra1. The circuit configuration of the power amplifier of the first embodiment (see FIG. 1) does not include this capacitance Ca1. Except for this feature, the power amplifier of the second embodiment is similar in configuration to the power amplifier of the first embodiment. In order to avoid undue repetition, components identical or corresponding to those described in connection with the first embodiment are denoted by the same reference symbols, and description of these components may be omitted or simplified when appropriate.

[Operation of Second Embodiment]

In the power amplifier of the second embodiment, the capacitance Ca1 is provided in series to the resistance Ra1. This capacitance Ca1 is energized only when the attenuator is in the ATT state, and since this capacitance is provided in series to the RF signal path, it acts to advance the signal phase.

Figure 6:
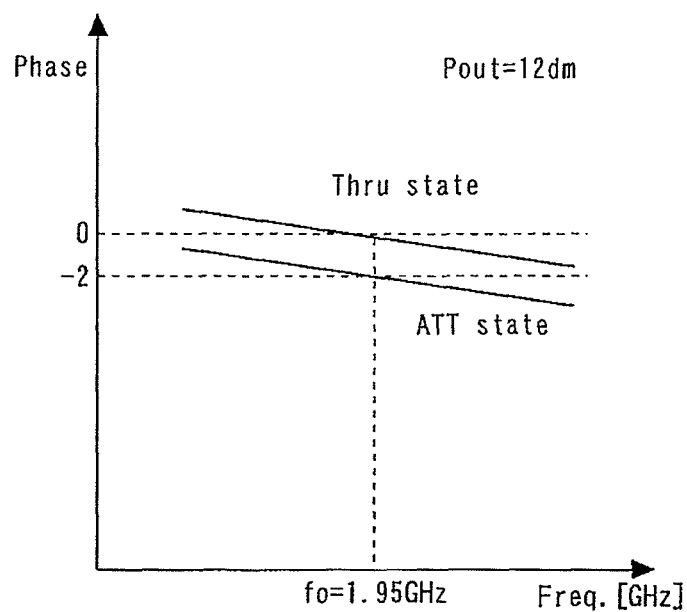
FIG. 6 is a diagram showing the phase characteristics of the power amplifier of the second embodiment of the present invention.

FIG. 6 is a diagram showing the phase characteristics of the power amplifier of the second embodiment. In accordance with the second embodiment, it is possible to reduce the change in phase shift in the power amplifier when the gain of the amplifier is switched (i.e., when the attenuator is switched between the pass-through state and the attenuation state), as shown in FIG. 6. For example, the values of Ca1 and Cp1 may be selected to be 5 pF and 15 pF, respectively. In terms of reducing the change in phase shift in the power amplifier, this has the same effect as that of Cp1 alone when Cp1 is approximately 100 pF.

It should be noted that in addition to this advantage, the power amplifier of the second embodiment also has the advantages of the power amplifier of the first embodiment. Further, various alterations described in connection with the power amplifier of the first embodiment may be made to the power amplifier of the second embodiment.

Third Embodiment

Figure 7:
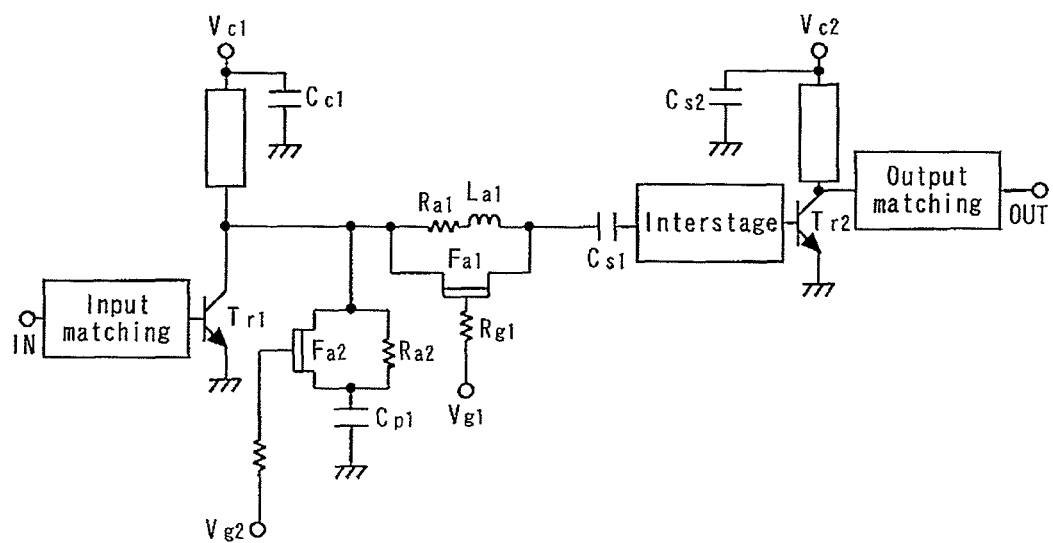
FIG. 7 is a circuit diagram of a power amplifier in accordance with a third embodiment of the present invention.

FIG. 7 is a circuit diagram of a power amplifier in accordance with a third embodiment of the present invention. Specifically, FIG. 7 is a diagram showing a power amplifier having an attenuator which includes an inductor device for compensating for the phase shift in the amplifier. An inductance for compensating for the phase shift is also hereinafter referred to as a "phase shift compensation L." This power amplifier differs from that of the second embodiment shown in FIG. 5 in that, instead of the capacitance Ca1, an inductor La1 is provided in series to the resistance Ra1. Except for this feature, the power amplifier of the third embodiment is similar in configuration to the power amplifier of the second embodiment. In order to avoid undue repetition, components identical or corresponding to those described in connection with the first embodiment are denoted by the same reference symbols, and description of these components may be omitted or simplified when appropriate.

Figure 8:
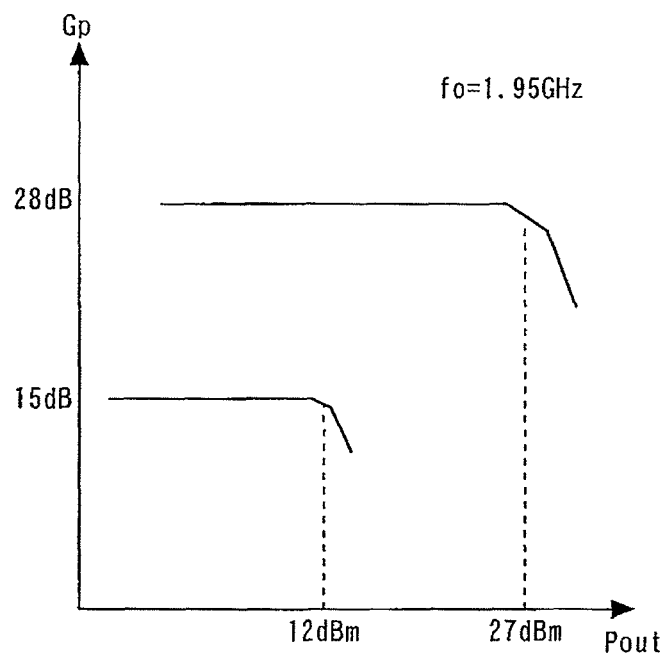
FIG. 8 is a diagram showing the output power Pout vs gain Gp characteristic of the power amplifier of the third embodiment of the present invention.
Figure 9:
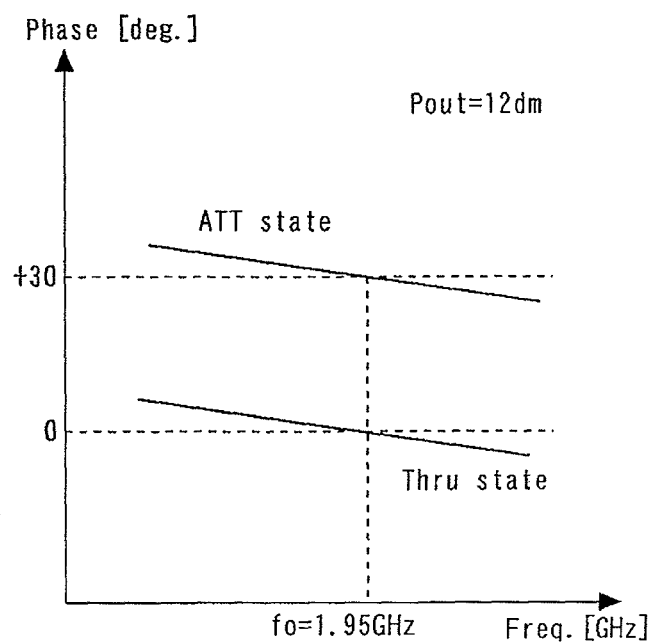
FIG. 9 is a comparative diagram showing the phase characteristics of a power amplifier similar to that of the third embodiment but without the inductor La1.
Figure 10:
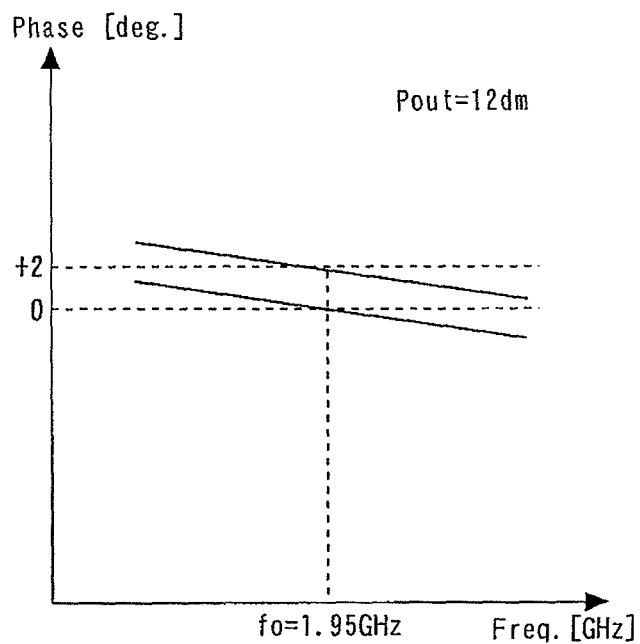
FIG. 10 shows the phase characteristics of the power amplifier with the inductor La1 shown in FIG. 7 in accordance with the third embodiment.

FIG. 8 is a diagram showing the output power Pout vs gain Gp characteristic of the power amplifier of the third embodiment. FIG. 9 is a comparative diagram showing the phase characteristics of a power amplifier similar to that of the third embodiment but without the inductor La1. FIG. 10 is a diagram showing the phase characteristics of the power amplifier of the third embodiment (having the attenuator which includes the phase shift compensation L provided on the output side of the first stage).

In the third embodiment, the inductor La1 is energized only when the attenuator is in the ATT state, and since the inductor is provided in series to the RF signal path, it acts to retard the signal phase. As described above, FIG. 9 is a comparative diagram showing the phase characteristics of a power amplifier similar to that of the third embodiment but without the inductor La1, and FIG. 10 shows the phase characteristics of the power amplifier with the inductor La1 shown in FIG. 7 in accordance with the third embodiment. As shown in FIG. 9, the phase characteristics of the power amplifier without La1 when the attenuator is in the ATT state leads those when the attenuator is in the Thru state. On the other hand, the addition of La1 reduces the change in phase shift in the power amplifier, as shown in FIG. 10. As a result, it is possible to reduce the change in phase shift in the power amplifier when the gain of the amplifier is switched (i.e., when the attenuator is switched between the pass-through state and the attenuation state).

In addition to this advantage, the power amplifier of the third embodiment also has the advantages of the power amplifier of the first embodiment. Further, various alterations described in connection with the power amplifier of the first embodiment may be made to the power amplifier of the third embodiment.

Fourth Embodiment

Figures 11, 12:
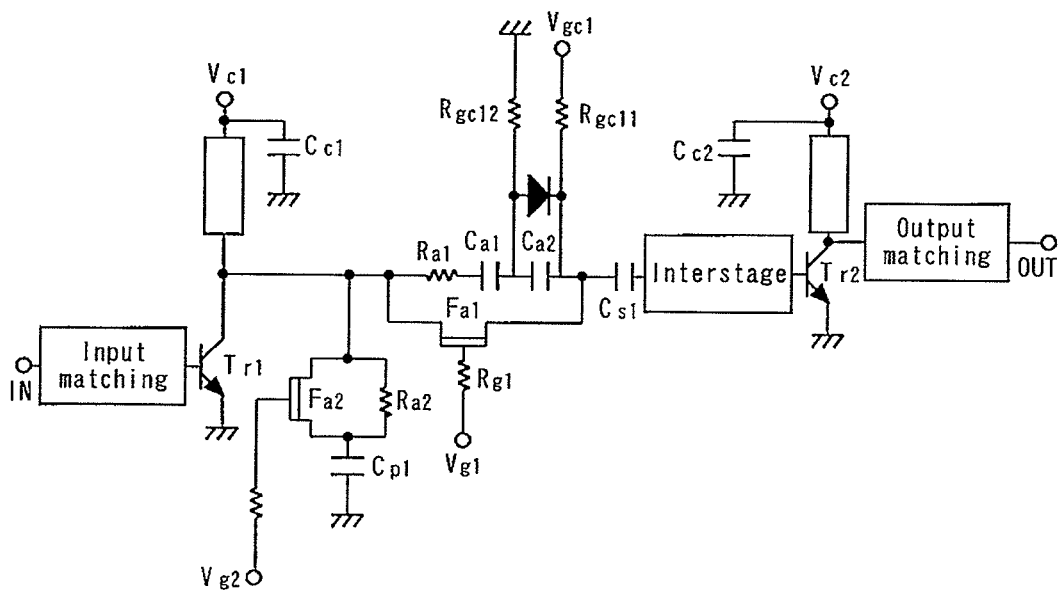
FIG. 11 is a circuit diagram of a power amplifier in accordance with a fourth embodiment of the present invention.
FIG. 12 is a circuit diagram of a power amplifier in accordance with a fifth embodiment of the present invention.

FIG. 11 is a circuit diagram of a power amplifier in accordance with a fourth embodiment of the present invention. The power amplifier of the fourth embodiment is a variation of that of the second embodiment in which the phase shift compensation capacitance can be varied (adjusted). Specifically, the power amplifier of the fourth embodiment differs from that of the second embodiment shown in FIG. 5 in that it includes a capacitance Ca2, a diode D1, resistances Rgc11 and Rgc12, and a control terminal Vgc1, in addition to the capacitance Ca1.

In the power amplifier of the fourth embodiment, Ca2 is directly connected in series to Ca1. As a result, in the fourth embodiment, the FET Fa1 is connected in parallel with the series connection of Ra1, Ca1, and Ca2. The diode D1 is connected in parallel with Ca2. The anode of D1 is connected to ground through Rgc12. The cathode of D1 is connected to the control terminal Vgc1 through Rgc11.

The operation of this power amplifier will be described. As the control voltage Vgc1 is positively increased, the depletion layer capacitance of D1 decreases and hence the combined capacitance of Ca1, Ca2, and D1 also decreases. This combined capacitance serves as a variable phase shift compensation capacitance, making it possible to adjust the amount of change in phase shift in the power amplifier to the desired value.

In addition to this advantage, the power amplifier of the fourth embodiment also has the advantages of the power amplifier of the second embodiment. It should be further noted that various alterations described in connection with the power amplifier of the first embodiment may be made to the power amplifier of the fourth embodiment.

Fifth Embodiment

FIG. 12 is a circuit diagram of a power amplifier in accordance with a fifth embodiment of the present invention. The power amplifier of the fifth embodiment is a variation of that of the third embodiment in which the phase shift compensation inductance can be varied (adjusted). Specifically, the power amplifier of the fifth embodiment differs from that of the third embodiment shown in FIG. 7 in that it includes an inductor La2, an FET Fc1, a resistance Rgc1, and a control terminal Vgc1 in addition to the inductor La1.

In the power amplifier of the fifth embodiment, La2 is directly connected in series to La1. As a result, in the fifth embodiment, the FET Fa1 is connected in parallel with the series connection of Ra1, La1, and La2. The FET Fc1 is connected in parallel with La2. The gate terminal of Fc1 is connected to Vgc1 through Rgc1.

The operation of this power amplifier will be described. When the control voltage Vgc1 is 0 V, the FET Fc1 is turned off and hence La2 is not shorted by Fc1. When the control voltage Vgc1 is equal to the voltage Vc1 (the voltage at the terminal Vc1), on the other hand, Fc1 is turned on and hence La2 is shorted by Fc1. In this way, the phase shift compensation inductance (which is formed by La1 and La2) can be varied, making it possible to adjust the amount of change in phase shift in the power amplifier to the desired value.

In addition to this advantage, the power amplifier of the fifth embodiment also has the advantages of the power amplifier of the third embodiment. Various alterations described in connection with the power amplifier of the first embodiment may be made to the power amplifier of the fifth embodiment.

Sixth Embodiment

Figure 13:
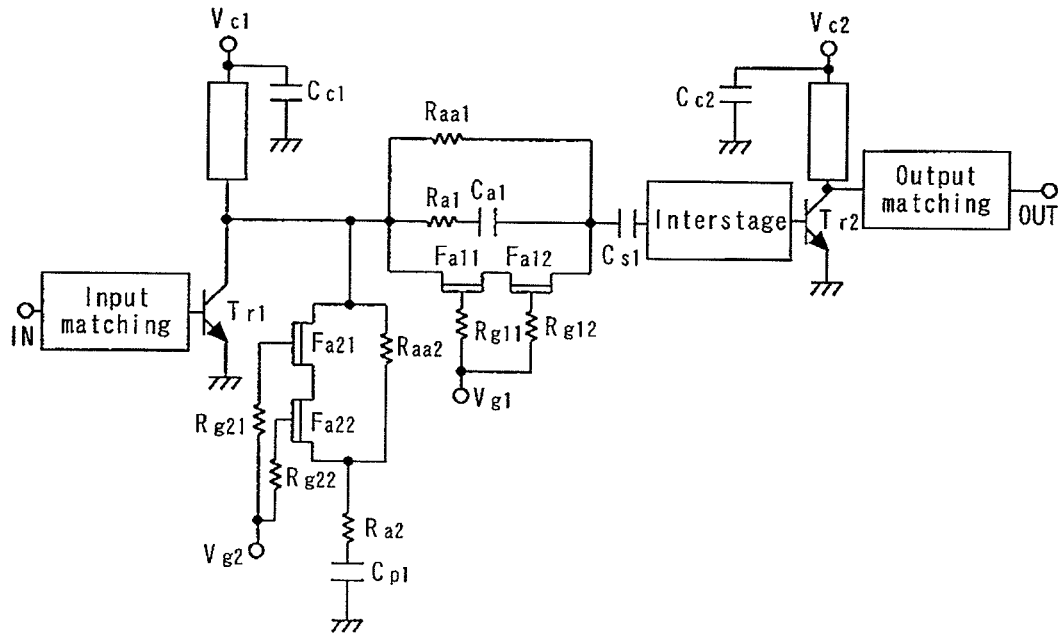
FIG. 13 is a circuit diagram of a power amplifier in accordance with a sixth embodiment of the present invention.

FIG. 13 is a circuit diagram of a power amplifier in accordance with a sixth embodiment of the present invention. The power amplifier of the sixth embodiment is provided with an attenuator which includes a parallel arm connected to the output of the first stage and which also includes a phase shift compensation capacitance Ca1. Further, the power amplifier of the sixth embodiment differs from that of the second embodiment in that its attenuator includes two cascaded FETs Fa11 and Fa12 instead of the FET Fa1 and also includes two cascaded FETs Fa21 and Fa22 instead of the FET Fa2 to increase the maximum allowable transmission power. The FETs Fa11, Fa12, Fa21, and Fa22 are D-mode FETs, and in FIG. 13 the reference symbols Rg11, Rg12, Rg21, and Rg22 denote resistances.

The series connection of Fa11 and Fa12 is connected in parallel with the series connection of Ra1 and Ca1. The gate of Fa11 is connected to the control terminal Vg1 through Rg11. The gate of Fa12 is connected to Vg1 through Rg12.

Further, the series connection of Fa21 and Fa22 is connected in parallel with Raa2. The gate of Fa21 is connected to the control terminal Vg2 through Rg21. The gate of Fa22 is connected to Vg2 through Rg22.

Thus, Fa11 and Fa12 are cascaded together and Fa21 and Fa22 are cascaded together to increase the maximum allowable transmission power of the attenuator. Theoretically, it is possible to increase the maximum allowable transmission power by approximately 6 dB.

In addition to this advantage, the power amplifier of the sixth embodiment also has the advantages of the power amplifier of the second embodiment. Various alterations described in connection with the power amplifier of the first embodiment may be made to the power amplifier of the sixth embodiment.

Seventh Embodiment

Figure 14:
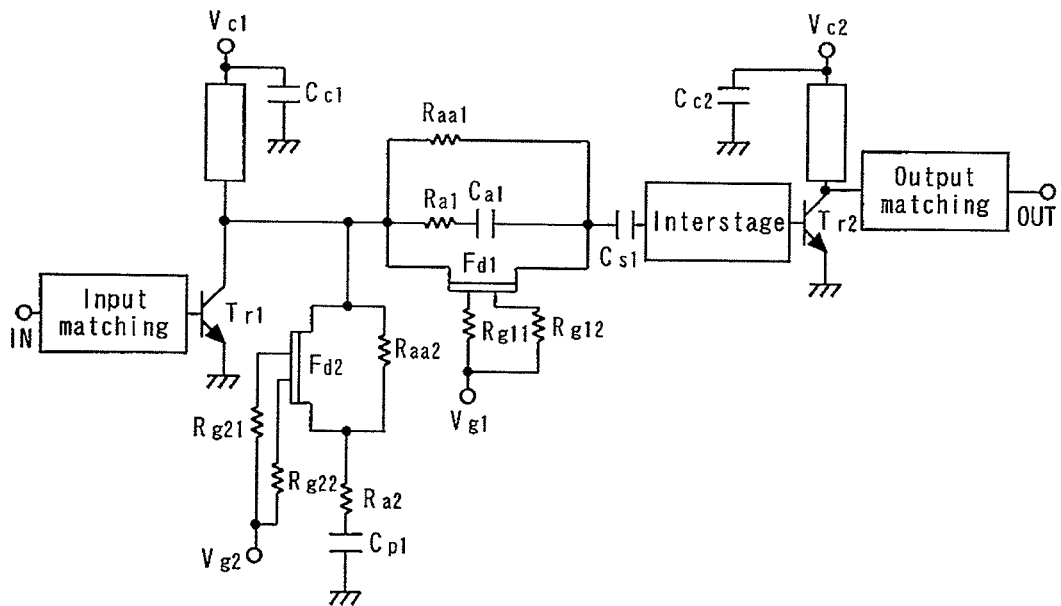
FIG. 14 is a circuit diagram of a power amplifier in accordance with a seventh embodiment of the present invention.

FIG. 14 is a circuit diagram of a power amplifier in accordance with a seventh embodiment of the present invention. The power amplifier of the seventh embodiment differs from that of the sixth embodiment in that the two cascaded FETs Fa11 and Fa12 are replaced by a single dual gate transistor Fd1 and the two cascaded FETs Fa21 and Fa22 are replaced by a single dual gate transistor Fd2. Like the configuration of the sixth embodiment shown in FIG. 13, this configuration also makes it possible to increase the maximum allowable transmission power of the attenuator.

In FIG. 13, the reference numerals Fd1 and Fd2 denote dual gate D-mode FETs, and Rg11 and Rg22 denote resistances. One of the two gates of Fd1 is connected to the control terminal Vg1 through Rg11, and the other gate is connected to Vg1 through a resistance Rg12. One of the two gates of Fd2 is connected to the control terminal Vg2 through a resistance Rg21, and the other gate is connected to Vg2 through Rg22.

In the power amplifier of the seventh embodiment, the dual gate FET in each arm is equivalent to a cascade of two general FETs, making it possible to increase the maximum allowable transmission power of the attenuator. Theoretically, the maximum allowable transmission power can be increased by approximately 6 dB. Further, the combined area of the dual gate FETs Fd1 and Fd2 can be smaller than that of the FETs Fa11, Fa12, Fa21, and Fa22 of the sixth embodiment, thus reducing chip layout area.

It should be noted that various alterations described in connection with the power amplifier of the first embodiment may be made to the power amplifier of the seventh embodiment.

Eighth Embodiment

Figure 15:
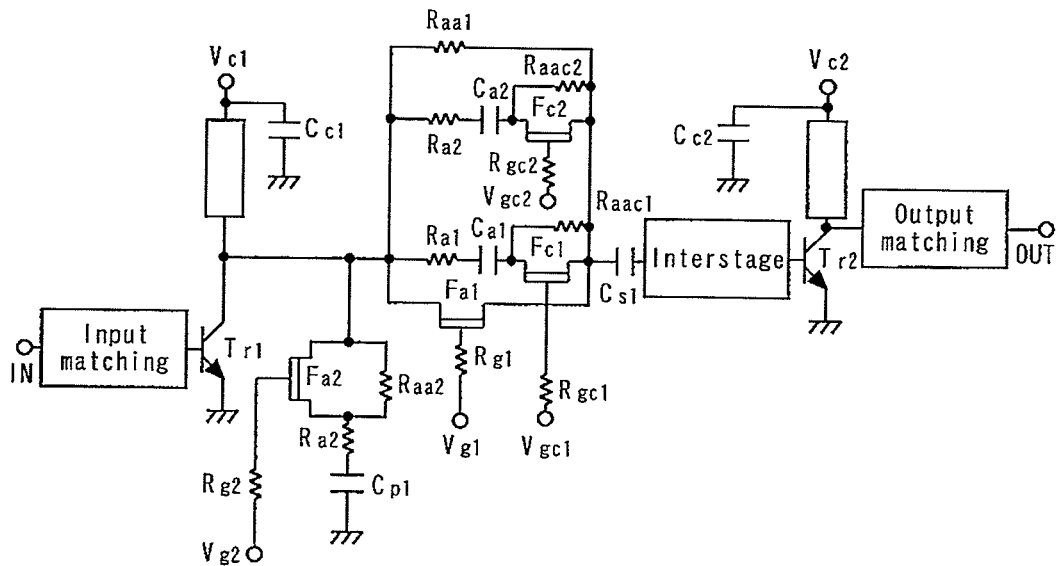
FIG. 15 is a circuit diagram of a power amplifier in accordance with a eighth embodiment of the present invention.

FIG. 15 is a circuit diagram of a power amplifier in accordance with an eighth embodiment of the present invention. In the power amplifier of the eighth embodiment, the phase shift compensation capacitance can be switched between different values.

Specifically, this power amplifier includes a capacitance Ca2 in addition to the capacitance Ca1 of the second embodiment. These two capacitances act as phase shift compensation capacitances, and the attenuator switches between them. In FIG. 15, the reference symbols Fc1 and Fc2 denote FETs; Ra1, Ra2, Raa1, Raac1, Raac2, Rgc1, and Rgc2 denote resistances; Ca1 and Ca2 denote capacitances; and Vgc1 and Vgc2 denote control voltages (or terminals).

In the eighth embodiment, Fc1 is connected in series to Ca1, as shown in FIG. 15. As a result, the FET Fa1 is connected in parallel with the series connection of Ra1, Ca1, and Fc1.

Further, Raac1 is connected in parallel with Fc1. The gate terminal of Fc1 is connected to Vgc1 through Rgc1.

On the other hand, the circuit consisting of Ra2, Ca2, Raac2, Fc2, Rgc2, and Vgc2 is connected in parallel with the series connection of Ra1, Ca1, and Fc1. Further, Ra2, Ca2, and Fc2 form a series circuit, and Raac2 is connected in parallel to Fc2. The gate terminal of Fc2 is connected to Vgc2 through Rgc2.

In this circuit configuration, Fc1 and Fc2 can be turned on and off by controlling the gate voltages applied thereto through the control terminals Vgc1 and Vgc2.

When the control voltage Vg1 is 0 V and the control voltage Vg2 is equal to the voltage Vc1, the FET Fa1 is turned off and the FET Fa2 is turned on, that is, the attenuator is in the ATT state (or attenuation state). In this state, if the control voltage Vgc1 is equal to the voltage Vc1 and the control voltage Vgc2 is 0 V, the capacitance Ca1 is selected to act as a phase shift compensation capacitance. On the other hand, if the control voltage Vgc1 is 0 V and the control voltage Vgc2 is equal to the voltage Vc1, then the capacitance Ca2 is selected to act as a phase shift compensation capacitance. This means that the values of Ca1 and Ca2 may be selected to be different from each other so as to be able to provide different magnitudes of phase shift compensation effect. By selectively using a plurality of phase shift compensation capacitances having different values, it is possible to adjust the amount of change in phase shift in the power amplifier to the desired value.

It should be noted that the power amplifier of the eighth embodiment includes the two phase shift compensation capacitances Ca1 and Ca2, and they are selectively used. It is to be understood, however, that the present invention is not limited to this particular configuration. For example, power amplifiers of other embodiments may include 3 or more phase shift compensation capacitances (Ca1, Ca2, Ca3, Ca4, . . . ), and these capacitances may be selectively used. In such cases, a circuit such as that consisting of Ra2, Ca2, Raac2, Fc2, Rgc2, and Vgc2 described above may be added for each added phase shift compensation capacitance.

In addition to the advantage described above, the power amplifier of the eighth embodiment also has the advantages of the power amplifier of the fourth embodiment. Various alterations described in connection with the power amplifier of the first embodiment may be made to the power amplifier of the eighth embodiment.

Ninth Embodiment

Figure 16:
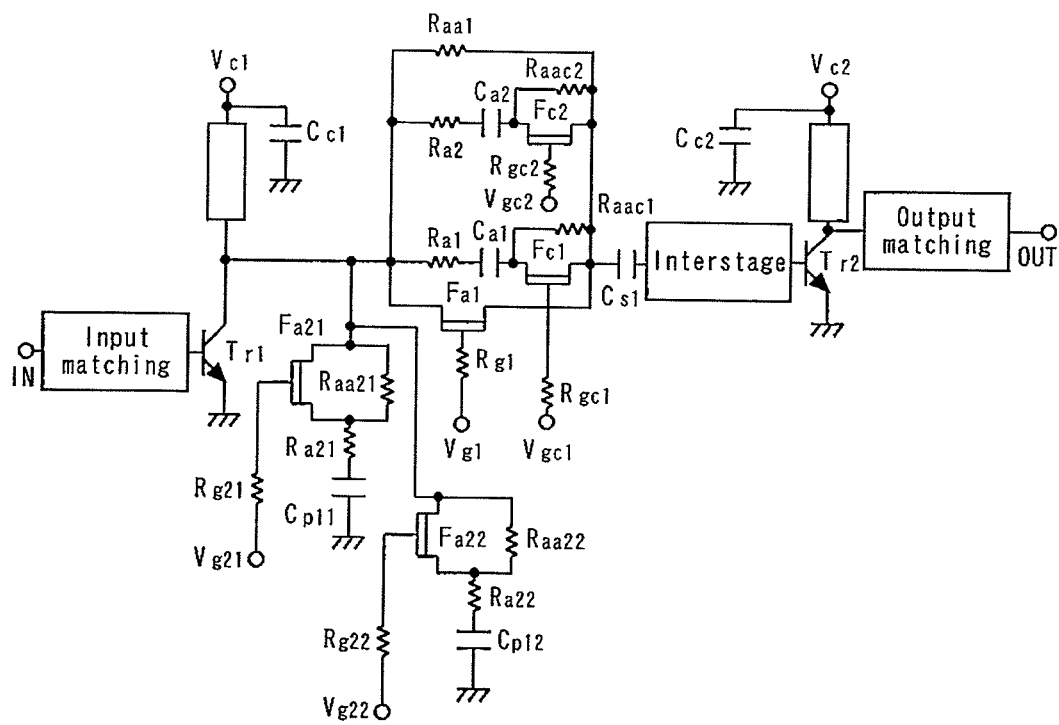
FIG. 16 is a circuit diagram of a power amplifier in accordance with a ninth embodiment of the present invention.

FIG. 16 is a circuit diagram of a power amplifier in accordance with a ninth embodiment of the present invention. In the power amplifier of the ninth embodiment, like the power amplifier of the eighth embodiment, the phase shift compensation capacitance can be switched between different values. Further in this power amplifier, the amount of attenuation produced by the attenuator can also be switched between different values.

In FIG. 16, the reference symbols Fa21 and Fa22 denote FETs; Ra21, Ra22, Raa21, Raa22, Rg21, and Rg22 denote resistances; Cp12 and Cp12 denote capacitances; and Vg21 and Vg22 denote control voltages (or terminals).

The attenuator of this power amplifier includes two parallel arms such as that of the eighth embodiment. (The parallel arm of the eighth embodiment consists of the components Fa2, Rg2, Vg2, Raa2, Ra2, and Cp1.) Specifically, Fa21, Rg21, Vg21, Raa21, Ra21, and Cp11 form a first parallel arm. Further, Fa22, Rg22, Vg22, Raa22, Ra22, and Cp12 form a second parallel arm. In the power amplifier of the ninth embodiment, these first and second parallel arms are connected in parallel with the first stage transistor Tr1.

The operation of this power amplifier will now be described. When the control voltage Vg1 is 0 V, the FET Fa1 is turned off, that is, the attenuator is in the ATT state (or attenuation state). In this state, if the control voltage Vg21 is equal to the voltage Vc1 and the control voltage Vg22 is 0 V, the resistance Ra21 and the capacitance Cp11 are connected to the output of Tr1 through the FET Fa21. On the other hand, if the control voltage Vg21 is 0 V and the control voltage Vg22 is equal to the voltage Vc1, then the resistance Ra22 and the capacitance Cp12 are connected to the output of Tr1 through the FET Fa22. Thus, the amount of attenuation produced by this attenuator can be changed by turning on and off Fa21 and Fa22. This means that the values of Ra21 and Ra22 and the values of Cp11 and Cp12 may be selected to be different from each other so as to be able to produce the desired amounts of attenuation. As a result, it is possible to select not only the value of the phase shift compensation capacitance and the amount of change in phase shift in the power amplifier, but also the amount of attenuation produced by the attenuator.

In addition to this advantage, the power amplifier of the ninth embodiment also has the advantages of the power amplifier of the eighth embodiment. Various alterations described in connection with the power amplifier of the first embodiment may be made to the power amplifier of the ninth embodiment.

Tenth Embodiment

Figure 17:
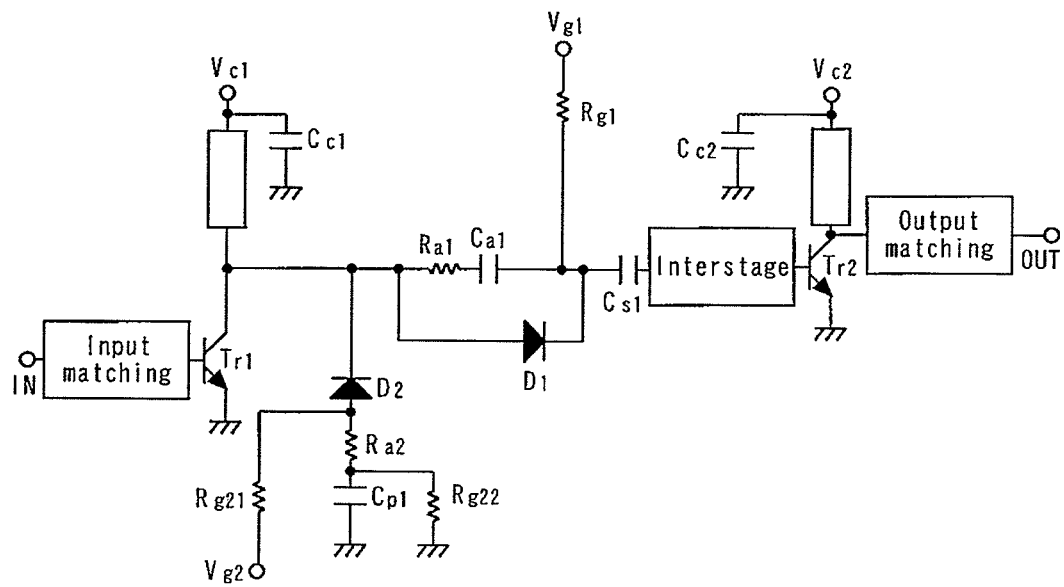
FIG. 17 is a circuit diagram of a power amplifier in accordance with a tenth embodiment of the present invention.

FIG. 17 is a circuit diagram of a power amplifier in accordance with a tenth embodiment of the present invention. The power amplifier of the tenth embodiment is similar to that of the second embodiment in that it includes an attenuator having a phase shift compensation capacitance, but also differs therefrom in that it uses diode switches instead of FET switches.

In FIG. 17, the reference numerals D1 and D2 denote diodes, and Rg1, Rg21, and Rg22 denote resistances. When the first and second stage transistors Tr1 and Tr2 are GaAs-HBTs, the diodes D1 and D2 are preferably base-collector junction diodes (also referred to as base-collector diodes or BC diodes). A BC diode switch is formed by a base-collector junction, which is similar to a p-i-n junction. For example, Japanese Laid-Open Patent Publication No. 2004-320352 describes a BC diode switch. A general GaAs-HBT process cannot be used to form FET switches, whose channel can be turned on merely by application of a voltage to the gate. Therefore, when Tr1 and Tr2 are GaAs-HBTs, BC diode switches may be formed to serve as RF (high frequency) switching devices.

The diode D1 is connected in parallel with the series connection of the resistance Ra1 and the capacitance Ca1. The junction, or line, between the cathode of D1 and one terminal of Ca1 is connected to the control terminal Vg1 through Rg1. The cathode of D2 is connected to the junction, or line, between Tr1 and Ra1. The anode of D2 is connected to one end of the resistance Ra2, and the capacitance Cp1 and Rg22 are connected to the other end of Ra2. One end of Rg21 is connected to the junction, or line, between the anode of D2 and Ra2, and the other end of Rg21 is connected to the control terminal Vg2.

The operation of this power amplifier will now be described. When the control voltage Vg1 is 0 V and the control voltage Vg2 equal to the voltage Vc1 (=3.4 V), the current Ig1 is negative and the current Ig2 is 0 mA. As a result, D1 is turned on and D2 is turned off, that is, the attenuator assumes the pass-through state (or Thru state). When Vg1 is equal to Vc1 and Vg2 is 0 V, on the other hand, Ig1 is 0 mA and Ig2 is negative. As a result, D1 is turned off and D2 is turned on, that is, the attenuator assumes the attenuation state (or ATT state). At that time, the series connection of Ra1 and Ca1 acts to provide phase shift compensation.

In accordance with the tenth embodiment, the function of the second embodiment can be implemented by use of components formed by an HBT process alone without forming FETs, resulting in reduced cost. It should be noted that various alterations described in connection with the power amplifier of the first embodiment may be made to the power amplifier of the tenth embodiment.

Eleventh Embodiment

Figure 18:
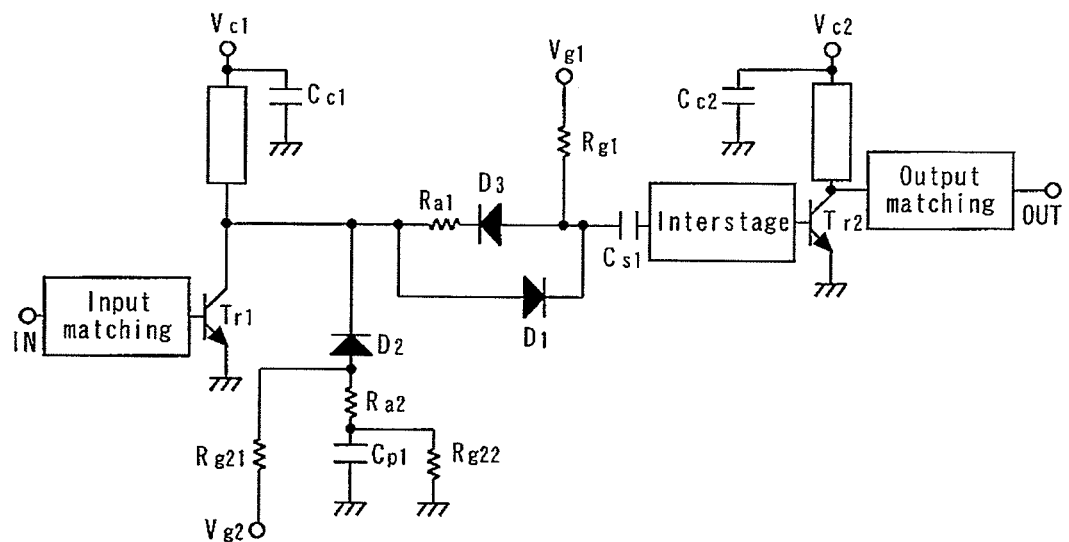
FIG. 18 is a circuit diagram of a power amplifier in accordance with an eleventh embodiment of the present invention.

FIG. 18 is a circuit diagram of a power amplifier in accordance with an eleventh embodiment of the present invention. The power amplifier of the eleventh embodiment is a variation of that of the tenth embodiment and includes a diode instead of the capacitance Ca1. This diode acts to perform the same phase shift compensation function as Ca1.

Specifically, the power amplifier of the eleventh embodiment differs from that of the tenth embodiment in that Ca1 is replaced by a diode D3. When the attenuator is in the ATT state, zero bias is applied to D3 and, as a result, D3 acts as a capacitance.

However, in general, the diode capacitor D3 tends to occupy a larger area than the ordinary capacitor Ca1, and therefore care must be taken in using it. The eleventh embodiment also has all the other advantages of the tenth embodiment.

Twelfth Embodiment

Figure 19:
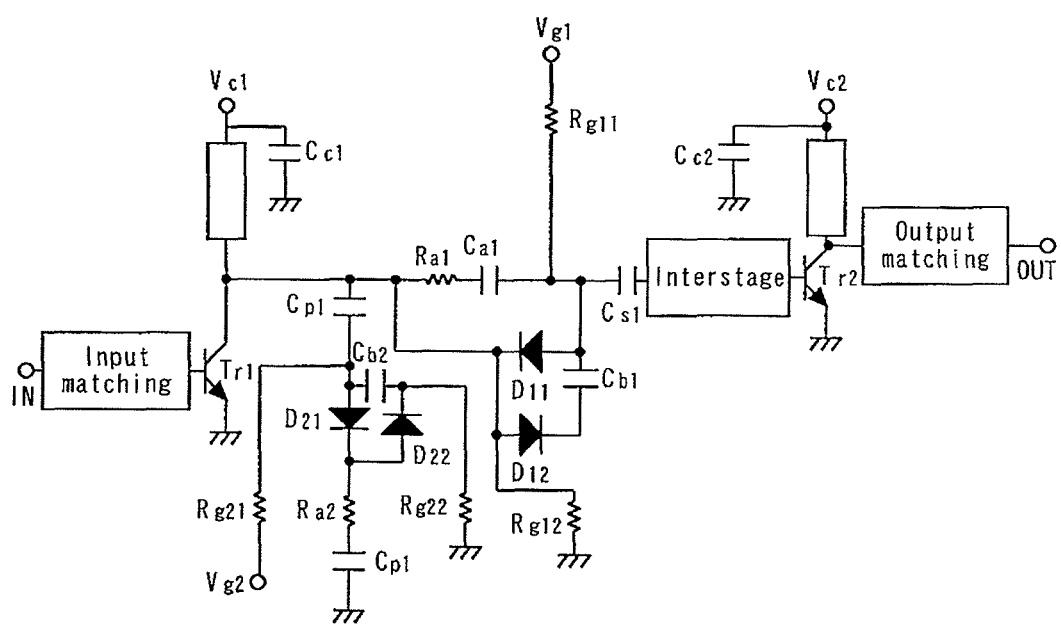
FIG. 19 is a circuit diagram of a power amplifier in accordance with a twelfth embodiment of the present invention.

FIG. 19 is a circuit diagram of a power amplifier in accordance with a twelfth embodiment of the present invention. The power amplifier of the twelfth embodiment is a variation of that of the tenth embodiment and includes AC-coupled BC diodes (or base-collector junction diodes) instead of the diodes D1 and D2 (which are used as diode switches), thereby increasing the maximum allowable transmission power of the switches. Specifically, the power amplifier shown in FIG. 19 differs from that of the tenth embodiment in that AC-coupled BC diode switches are substituted for and perform the functions of the diodes D1 and D2.

In FIG. 19, the reference symbols D11, D12, D21, and D22 denote base-collector junction diodes (BC diodes); R1 and R2 denote resistances; and Cb1, Cb2, and Cp2 denote capacitors.

The configurations of the AC-coupled BC diode switches will now be described. The first stage diode D11 and the second stage diode D12 are connected in parallel with each other. The cathode of the second stage diode D12 is connected to the anode of the first stage diode D11 through the first capacitor Cb1. The junction, or line, between the cathode of D11 and the anode of D12 is connected to ground through the resistance Rg12. Like the diode D1 in the tenth embodiment, the circuit consisting of D11, D12, Cb1, and Rg12 is connected in parallel with the series connection of the resistance Ra1 and the capacitance Ca1.

Further, the first stage diode D21 and the second stage diode D22 are also connected in parallel with each other. The cathode of the second stage diode D22 is connected to the anode of the first stage diode D21 through the second capacitor Cb2. Thus, the parallel arm connected to the output of the first stage transistor Tr1 includes Cp2, D21, Cb2, and D22, instead of the diode D2 of the attenuator of the tenth embodiment.

The diodes D11 and D12 are DC connected in series to each other, and also AC connected in parallel to each other through the capacitor Cb1. Likewise, the diodes D21 and D22 are DC connected in series to each other, and also AC connected in parallel to each other through the capacitor Cb2. In this configuration, when a High voltage level is applied to the control voltage terminal Vg1, a common DC bias current flows through D11 and D12. From the AC point of view, however, this means that a DC bias current twice as large as this common DC bias current flows through the switch. Likewise, when a High voltage level is applied to the control voltage terminal Vg2, a common DC bias current flows through D21 and D22. From the AC point of view, however, this means that a DC bias current twice as large as this common DC bias current flows the switch. As a result, the maximum allowable transmission power of the AC-coupled BC diode switches is approximately 4 times that of switches using a single diode. For more detailed information, see Japanese Laid-Open Patent Publication No. 2007-74028.

Thus, the switches described above can transmit power four times greater than that which can be transmitted by switches using a single diode with the same bias current. Therefore, theoretically it is possible to increase the maximum allowable transmission power by approximately 6 dB, as compared to the tenth embodiment. The twelfth embodiment also retains the advantages of the tenth embodiment.

FIG. 19 shows an attenuator having two diodes for each arm. In other embodiments, however, an attenuator having three or more diodes for each arm may be used to improve the maximum allowable transmission power.

The power amplifiers of the second, third, and eleventh embodiments have a common technical feature; specifically, they include components (namely, capacitances, inductances, or diodes) for phase shift compensation. Therefore, they have the same advantages.

The power amplifiers of the fourth, fifth, and eighth embodiments have a common technical feature; specifically, they include a circuit for varying the phase shift compensation effect, namely, varying the value of a capacitance or inductance for phase shift compensation. That is, they are advantageous in that the amount of phase shift compensation can be varied.

The power amplifiers of the sixth, seventh, twelfth embodiments have a common technical feature; specifically, they include a circuit for increasing the maximum allowable transmission power. That is, they have the advantage of increased maximum allowable transmission power.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-283156, filed on Dec. 20, 2010 including specification, claims, drawings and summary, on which the Convention priority of the present application is based, are incorporated herein by reference in its entirety.

What is claimed is:

1. A power amplifier comprising:
a first amplifier unit;
a second amplifier unit for receiving, along a signal connecting path, a signal from the first amplifier unit and amplifying the signal; and
an attenuator connected to the signal connecting path between the first and second amplifier units, wherein
the attenuator comprises
a plurality of arms, including a first parallel arm and a series arm, and
switches connected to the plurality of arms to switch the electrical connection states of the arms with respect to the first and second amplifier units,
the first parallel arm and the series arm are arranged, in that order, as viewed from the first amplifier unit toward the second amplifier unit,
the first parallel arm is the closest arm, with respect to electrical connection, of the arms to the first amplifier unit and is connected at one end to a connection point on the signal connecting path between the first and second amplifier units, and
the series arm follows the first parallel arm, as viewed from the first amplifier unit toward the second amplifier unit, and is connected in series with the signal connecting path between the connection point of the first parallel arm to the signal connecting path and second amplifier unit.

2. The power amplifier according to claim 1, wherein the power amplifier further comprises a capacitive element connected in series with the series arm in the signal connecting path.

3. The power amplifier according to claim 2, wherein the capacitive element is a capacitor having a variable capacitance.

4. The power amplifier according to claim 1, wherein
the first parallel arm includes
a first capacitor connected at a first end to the signal connecting path between the first and second amplifier units, a first base-collector (BC) diode having an anode and a cathode and connected at the anode to a second end of the first capacitor, a second BC diode having an anode and a cathode and connected at the anode to the cathode of the first BC diode, a second capacitor connected at a first end between the first BC diode and the first capacitor and, at a second end, to the cathode of the second BC diode, and a first control voltage terminal for controlling the voltage at a point between the first capacitor and the first BC diode, and the series arm includes a resistance connected at a first end to the first amplifier unit and, at a second end, to the second amplifier unit, a third BC diode having an anode and a cathode and connected in parallel with the resistance so that the cathode is connected between the first end of the resistance and the first amplifier unit and the anode is connected between the second end of the resistance and the second amplifier unit, a fourth BC diode having an anode and a cathode and connected at the anode to the cathode of the third BC diode, a third capacitor connected at a first end to the anode of the third BC diode and, at a second end, to the cathode of the fourth BC diode, and a second control voltage terminal for controlling the voltage of the anode of the third BC diode.

5. The power amplifier according to claim 1, wherein the attenuator is an L attenuator.

6. The power amplifier according to claim 1, wherein:
the attenuator is a Π (pi) attenuator;
the plurality of arms includes the first parallel arm, the series arm, and a second parallel arm; and
the first parallel arm, the series arm, and the second parallel arm are arranged in succession, in that order, as viewed from the first amplifier unit toward the second amplifier unit.

7. The power amplifier according to claim 1, wherein:
each of the first and second amplifier units includes a heterojunction bipolar transistor;
the switches of the attenuator are field effect transistors; and
the heterojunction bipolar transistors and the field effect transistors are formed on the same semiconductor substrate in a BiFET process.

8. The power amplifier according to claim 2, wherein the capacitive element is a capacitor.

9. The power amplifier according to claim 1, wherein the power amplifier further comprises an inductive element connected in series with the series arm in the signal connecting path.

10. The power amplifier according to claim 9, wherein the inductive element is an inductor having variable inductance.

11. The power amplifier according to claim 2, wherein the capacitive element is a diode having a cathode and an anode and connected so that the cathode faces the first amplifier unit and the anode faces the second amplifier unit.

12. The power amplifier according to claim 9, wherein the inductive element is an inductor.

13. The power amplifier according to claim 9, wherein the inductive element is a diode having a cathode and an anode and connected so that the cathode faces the first amplifier unit and the anode faces the second amplifier unit.

* * * * *